(12) United States Patent
Kim

(10) Patent No.: US 12,417,972 B2
(45) Date of Patent: Sep. 16, 2025

(54) SEMICONDUCTOR PACKAGE

(71) Applicant: SAMSUNG ELECTRONICS CO., LTD., Suwon-si (KR)

(72) Inventor: Jongyoun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 433 days.

(21) Appl. No.: 18/096,861

(22) Filed: Jan. 13, 2023

(65) Prior Publication Data
US 2023/0317590 A1   Oct. 5, 2023

(30) Foreign Application Priority Data

Mar. 29, 2022 (KR) .......................... 10-2022-0039150

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4857* (2013.01); *H01L 23/3128* (2013.01); *H01L 23/544* (2013.01); *H01L 24/20* (2013.01); *H10B 80/00* (2023.02); *H01L 23/49822* (2013.01); *H01L 24/05* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 2223/54406* (2013.01); *H01L 2223/54413* (2013.01); *H01L 2223/5442* (2013.01); *H01L 2224/05624* (2013.01); *H01L 2224/05647* (2013.01);

(Continued)

(58) Field of Classification Search
CPC ....... H01L 2221/68372; H01L 21/6835; H01L 21/568; H01L 2924/3511; H01L 23/16; H01L 23/3128; H01L 23/562; H01L 2223/54413; H01L 2223/54486; H01L 23/13; H01L 23/49811; H01L 23/49827; H01L 23/49816; H01L 23/5389; H01L 25/105; H01L 2225/1035; H01L 2225/1041; H01L 2225/1058; H01L 24/20; H01L 24/19
See application file for complete search history.

(56) References Cited

U.S. PATENT DOCUMENTS 8,766,418 B2   7/2014   Iwase et al.
9,589,900 B2   3/2017   Su et al.
(Continued)

*Primary Examiner* — Elmito Breval
(74) *Attorney, Agent, or Firm* — Sughrue Mion, PLLC

(57) ABSTRACT

A semiconductor package is provided. The semiconductor package includes: a first redistribution substrate; a semiconductor chip provided on the first redistribution substrate; a molding layer provided on the first redistribution substrate and the semiconductor chip; and a second redistribution substrate provided on the molding layer. The second redistribution substrate includes: redistribution patterns spaced apart from one another; a first dummy conductive pattern spaced apart from the redistribution patterns; an insulating layer provided on the first dummy conductive pattern; and a marking metal layer provided on the insulating layer and spaced apart from the first dummy conductive pattern. Sidewalls of the marking metal layer overlap the first dummy conductive pattern along a vertical direction perpendicular to an upper surface of the first redistribution substrate.

20 Claims, 24 Drawing Sheets

(51) Int. Cl.
*H01L 23/00* (2006.01)
*H01L 23/31* (2006.01)
*H01L 23/544* (2006.01)
*H10B 80/00* (2023.01)

(52) U.S. Cl.
CPC ............... *H01L 2224/13147* (2013.01); *H01L 2224/16227* (2013.01); *H01L 2224/211* (2013.01); *H01L 2224/2919* (2013.01); *H01L 2224/32225* (2013.01); *H01L 2224/48091* (2013.01); *H01L 2224/48105* (2013.01); *H01L 2224/48228* (2013.01); *H01L 2224/73204* (2013.01); *H01L 2924/0665* (2013.01)

(56) References Cited

U.S. PATENT DOCUMENTS

| | | |
|---|---|---|
| 9,811,693 B2 | 11/2017 | Kawashima |
| 10,163,807 B2 | 12/2018 | Chen et al. |
| 10,522,472 B2 | 12/2019 | De Langen et al. |
| 10,825,778 B2 | 11/2020 | Bae et al. |
| 11,018,088 B2 | 5/2021 | Hsieh et al. |
| 11,107,772 B2 | 8/2021 | Chiang et al. |
| 2008/0157341 A1 | 7/2008 | Yang |
| 2021/0074691 A1 | 3/2021 | Lee et al. |

SEMICONDUCTOR PACKAGE

CROSS-REFERENCE TO RELATED APPLICATION

This application claims priority under 35 U.S.C. § 119 to Korean Patent Application No. 10-2022-0039150, filed on Mar. 29, 2022, in the Korean Intellectual Property Office, the disclosure of which is incorporated by reference herein in its entirety.

BACKGROUND

The present disclosure relates to a semiconductor package, and more particularly, relates to a semiconductor package including a redistribution substrate and a method of manufacturing the same.

A semiconductor package may be implemented in a form suitable for use in an electronic product using an integrated circuit chip. In a semiconductor package, a semiconductor chip may be mounted on a printed circuit board and electrically connected thereto using bonding wires or bumps. With development of electronics industry, various studies are being conducted for reliability improvement, high integration, and miniaturization of the semiconductor package.

SUMMARY

One or more example embodiments provide a semiconductor package having improved reliability and durability.

According to an example embodiment, a semiconductor package includes: a first redistribution substrate; a semiconductor chip provided on the first redistribution substrate; a molding layer provided on the first redistribution substrate and the semiconductor chip; and a second redistribution substrate provided on the molding layer. The second redistribution substrate includes: redistribution patterns spaced apart from one another; a first dummy conductive pattern spaced apart from the redistribution patterns; an insulating layer provided on the first dummy conductive pattern; and a marking metal layer provided on the insulating layer and spaced apart from the first dummy conductive pattern. Sidewalls of the marking metal layer overlap the first dummy conductive pattern along a vertical direction perpendicular to an upper surface of the first redistribution substrate.

According to an example embodiment, a semiconductor package includes: a first redistribution substrate; a semiconductor chip provided on the first redistribution substrate; a molding layer provided on the first redistribution substrate and the semiconductor chip; and a second redistribution substrate provided on the molding layer. The second redistribution substrate includes: a redistribution pattern; a first dummy conductive pattern insulated from the redistribution pattern; a second dummy conductive pattern insulated from the redistribution pattern; a third dummy conductive pattern insulated from the redistribution pattern; and a marking metal layer provided on the second dummy conductive pattern. The first dummy conductive pattern is provided between the second dummy conductive pattern and the third dummy conductive pattern. The marking metal layer overlaps a first portion of the first dummy conductive pattern along a vertical direction perpendicular to an upper surface of the first redistribution substrate, and is offset from a second portion of the first dummy conductive pattern along the vertical direction.

According to an example embodiment, a semiconductor package includes: a first redistribution substrate including a first insulating layer, a first seed pattern, and a first redistribution pattern; a solder ball provided on a bottom surface of the first redistribution substrate; a semiconductor chip provided on a top surface of the first redistribution substrate; conductive structures provided on the top surface of the first redistribution substrate and spaced apart from the semiconductor chip along a horizontal direction parallel to an upper surface of the first redistribution substrate; a molding layer provided between the semiconductor chip and the conductive structures, and on the semiconductor chip; and a second redistribution substrate provided on the molding layer. The second redistribution substrate includes: second redistribution patterns electrically connected to the conductive structures; second redistribution pads provided on and electrically connected to the second redistribution patterns; a dummy conductive pattern spaced apart from the second redistribution patterns along the horizontal direction; and a marking metal layer spaced apart from the second redistribution pads along the horizontal direction. The dummy conductive pattern includes a first dummy conductive pattern, a second dummy conductive pattern, and a third dummy conductive pattern that are spaced apart from one another along the horizontal direction. The marking metal layer overlaps a first portion of the first dummy conductive pattern and the second dummy conductive pattern along a vertical direction perpendicular to the upper surface of the first redistribution substrate. The marking metal layer is offset from a second portion of the first dummy conductive pattern and the third dummy conductive pattern along the vertical direction.

BRIEF DESCRIPTION OF THE DRAWINGS

The above and other aspects and features will be more clearly understood from the following description of example embodiments taken in conjunction with the accompanying drawings, in which.

DETAILED DESCRIPTION

Figure 1A:
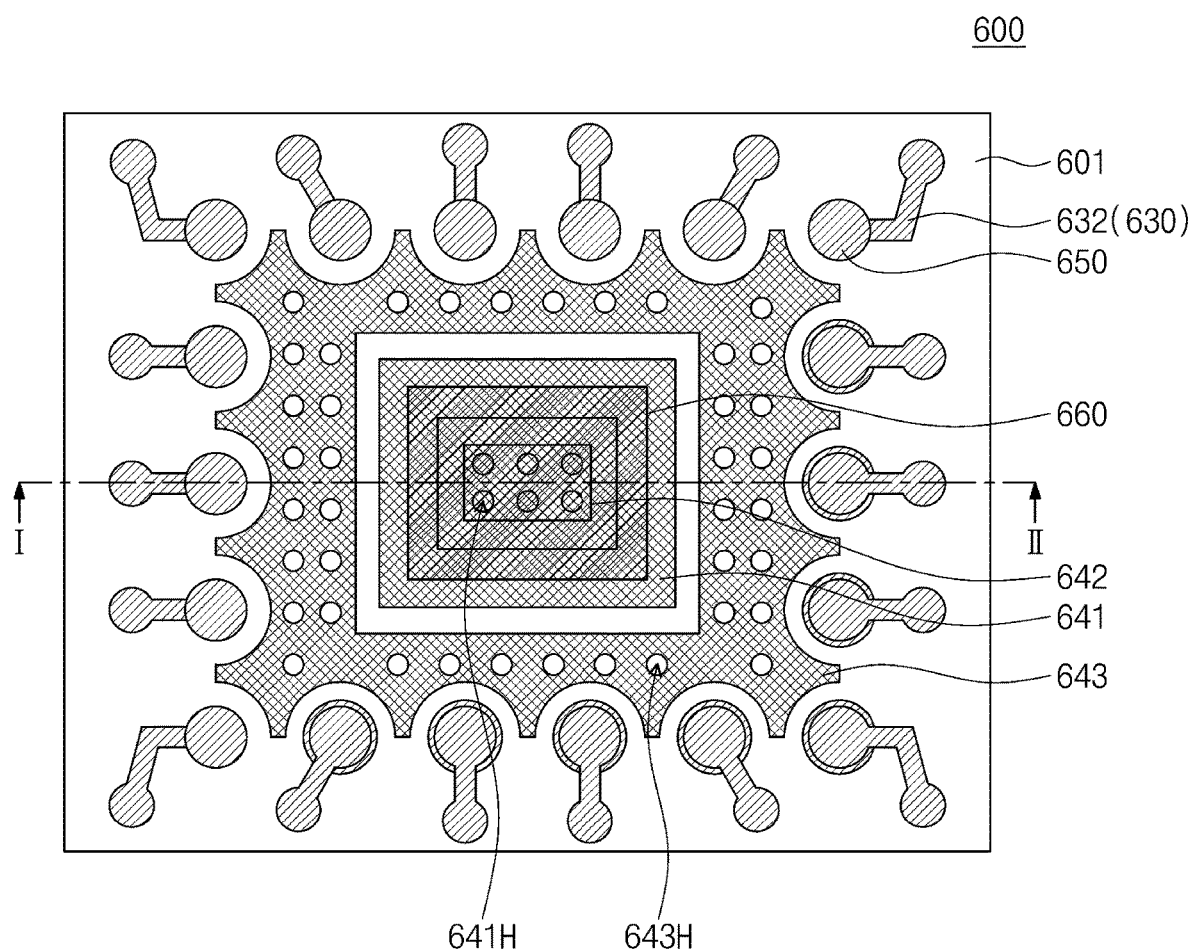
FIG. 1A is a plan view illustrating a second redistribution substrate of a semiconductor package according to example embodiments.

Example embodiments will be described more fully hereinafter with reference to the accompanying drawings. The same reference numerals may refer to the same elements throughout. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present.

Figure 1B:
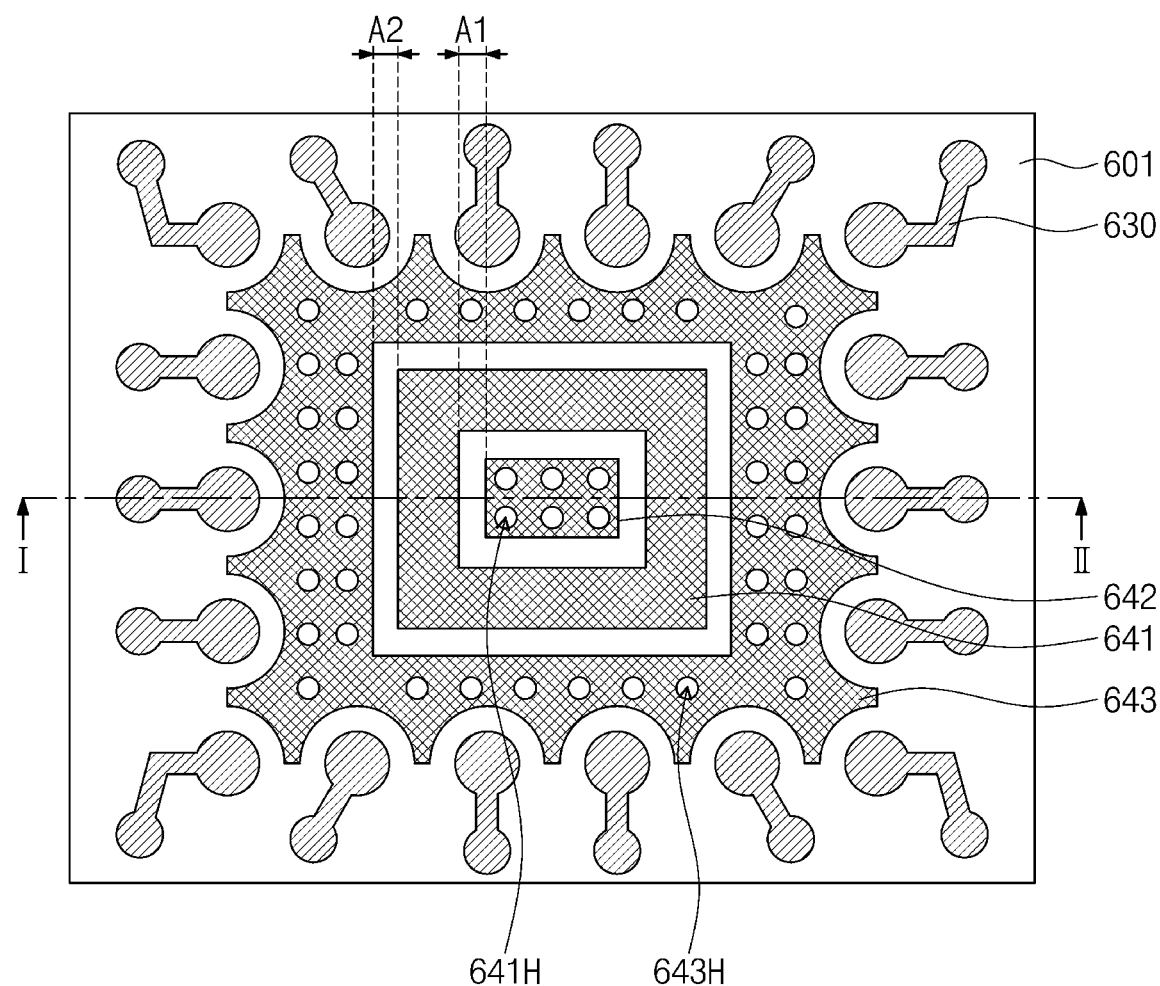
FIG. 1B is a plan view illustrating an arrangement of dummy conductive patterns and second redistribution patterns of a second redistribution substrate according to example embodiments.
Figure 1C:
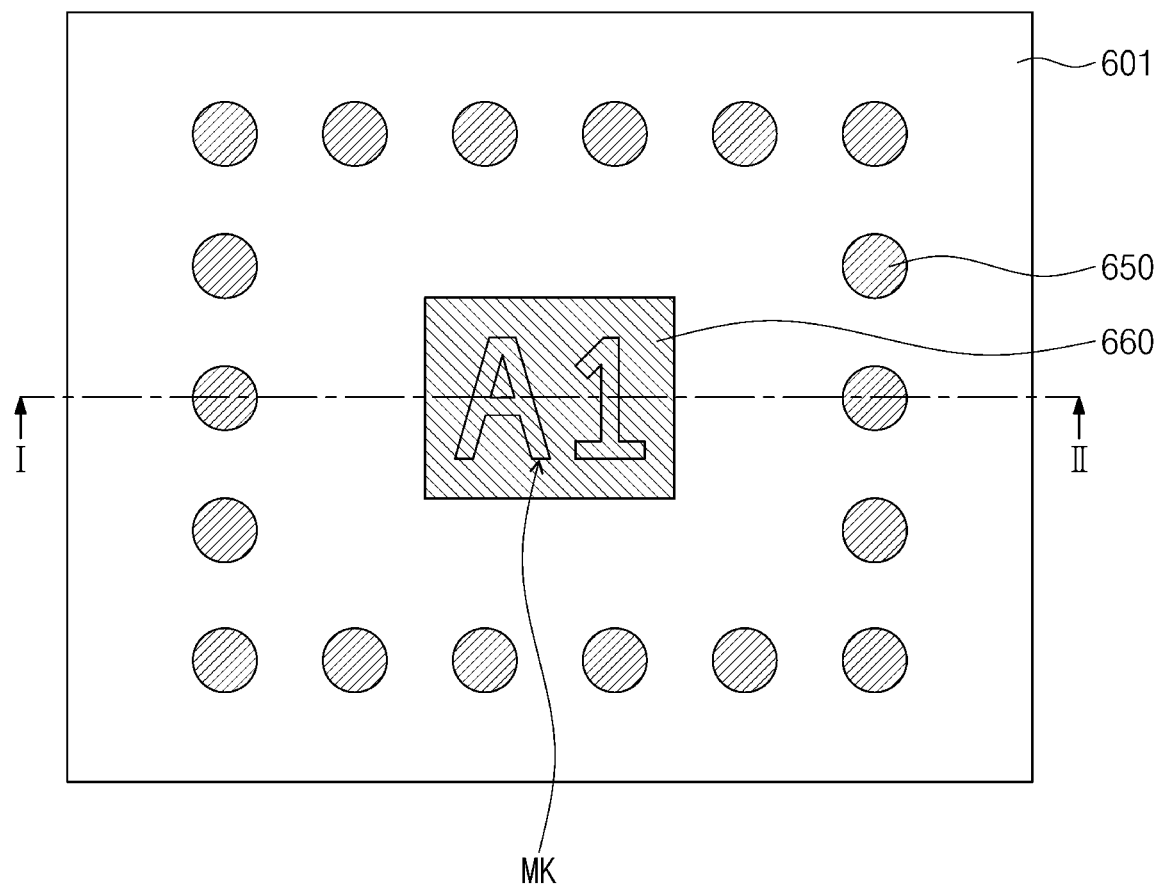
FIG. 1C is a plan view illustrating arrangement of a marking metal layer and second redistribution pads of a second redistribution substrate according to example embodiments.
Figure 1D:
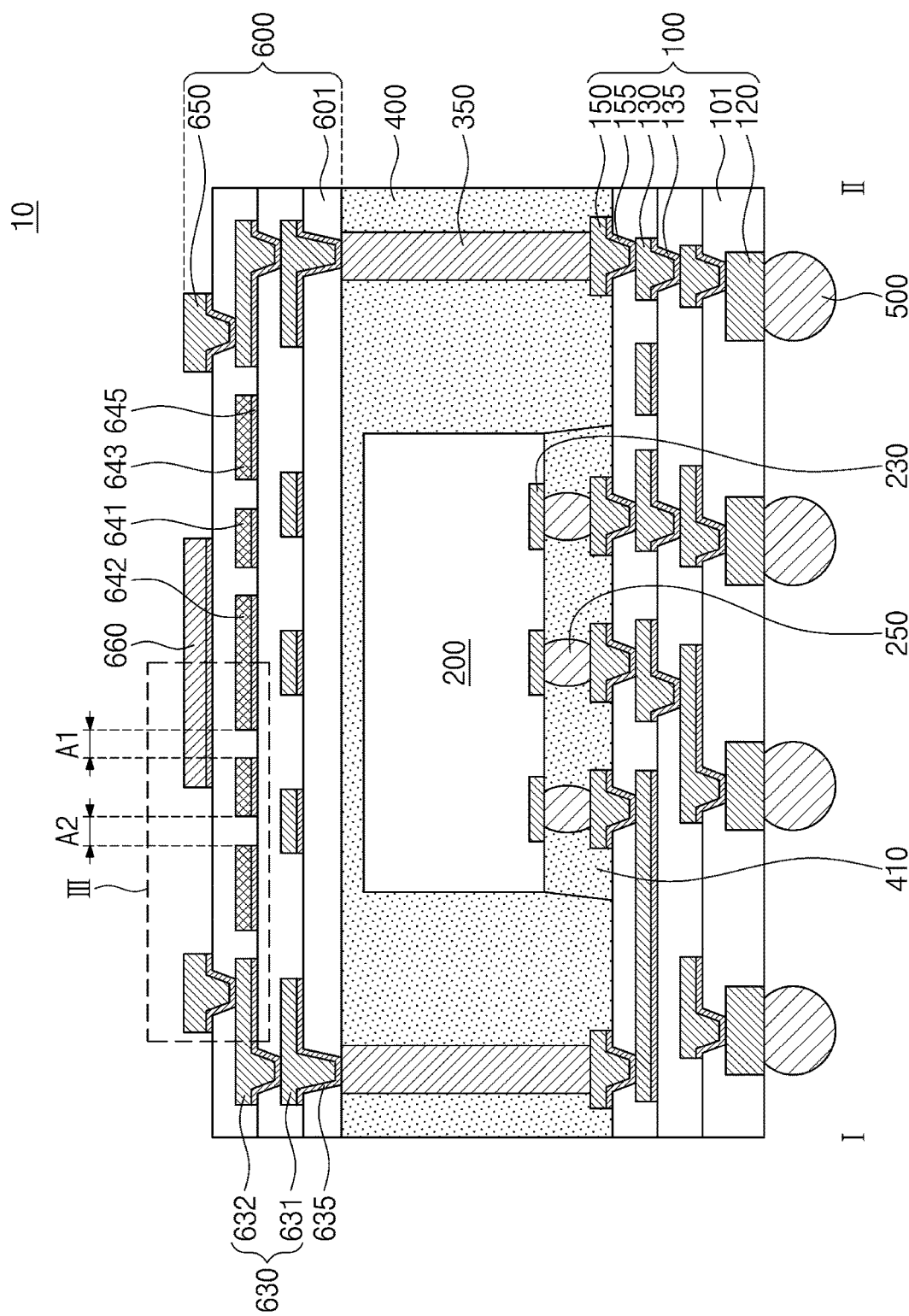
FIG. 1D is a cross-sectional view taken along line I-II of FIG. 1A.
Figure 1E:
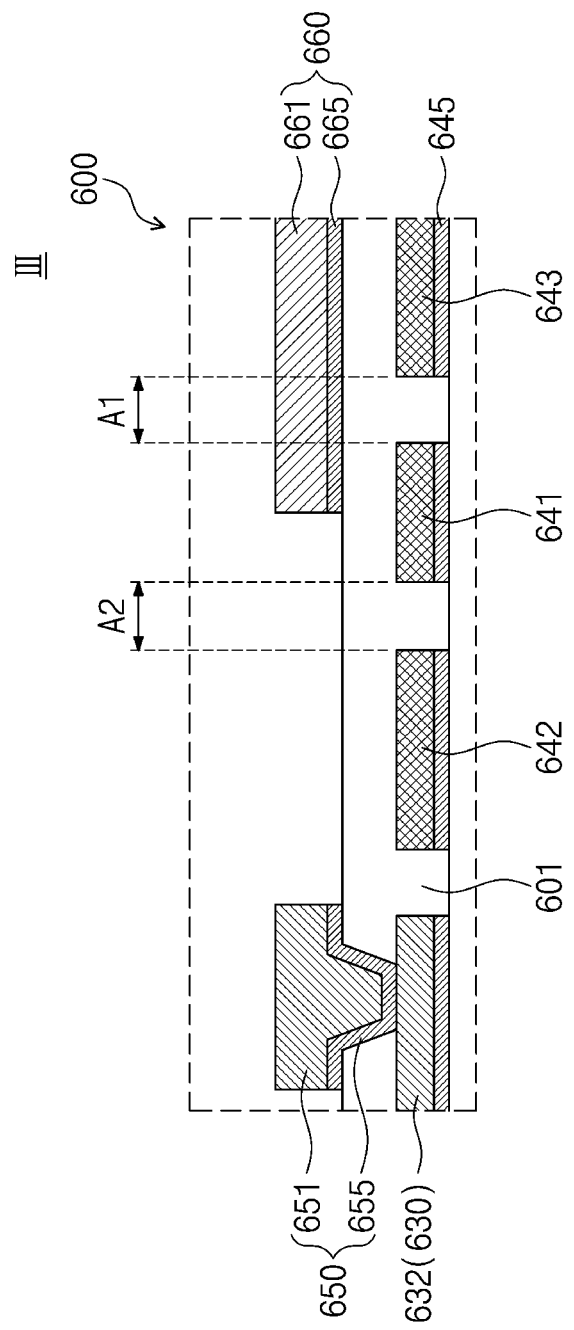
FIG. 1E is an enlarged view of region "III" of FIG. 1D.
Figure 1F:
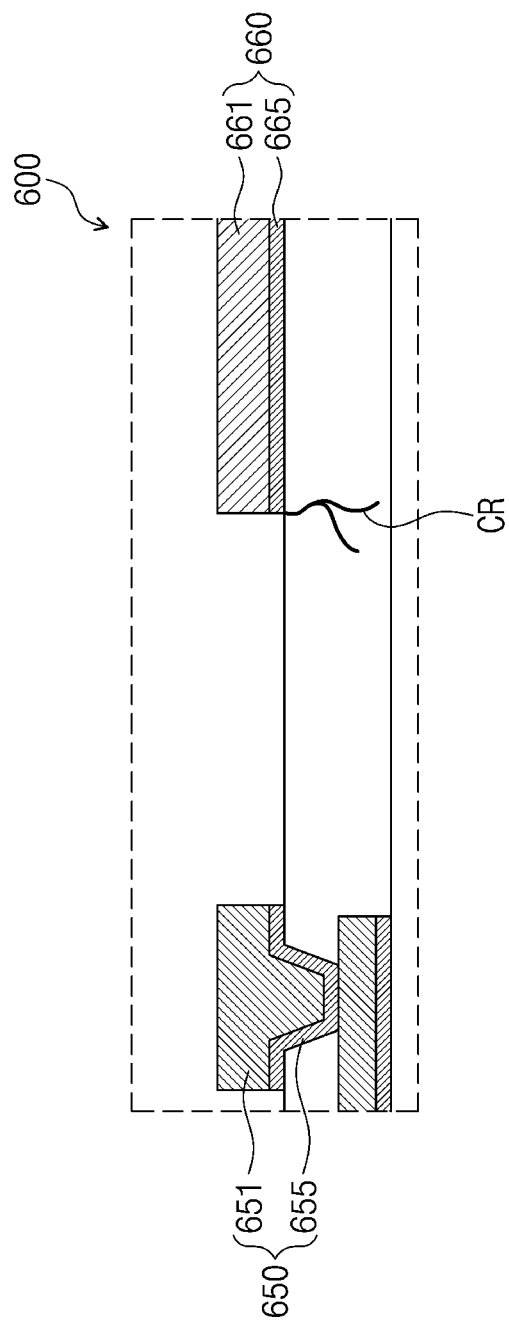
FIG. 1F is a view for illustrating a related marking metal layer.

FIG. 1A is a plan view illustrating a second redistribution substrate of a semiconductor package according to example embodiments. FIG. 1B is a plan view illustrating an arrangement of dummy conductive patterns and second redistribution patterns of a second redistribution substrate according to example embodiments. FIG. 1C is a plan view illustrating arrangement of a marking metal layer and second redistribution pads of a second redistribution substrate according to example embodiments FIG. 1D is a cross-sectional view taken along line I-II of FIG. 1A. FIG. 1E is an enlarged view of region "III" of FIG. 1D. FIG. 1F is a view for illustrating a related marking metal layer. FIG. 1D corresponds to a cross-section taken along line I-II of FIG. 1B and a cross-section taken along line I-II of FIG. 1C.

Referring to FIGS. 1A to 1E, a semiconductor package 10 may be a lower package. The semiconductor package 10 may include a first redistribution substrate 100, solder balls 500, a semiconductor chip 200, conductive structures 350, a molding layer 400, and a second redistribution substrate 600.

As shown in FIG. 1D, the first redistribution substrate 100 may include a first insulating layer 101, first redistribution patterns 130, first seed patterns 135, and first redistribution pads 150. The first insulating layer 101 may include, for example, an organic material such as a photo-imageable dielectric (PID) material. The photosensitive insulating material may include, for example, at least one of a photosensitive polyimide, polybenzoxazole, a phenol-based polymer, and a benzocyclobutene-based polymer. The first redistribution substrate 100 may include a plurality of stacked first insulating layers 101. The number of the first insulating layers 101 that are stacked may be variously modified. For example, the plurality of first insulating layers 101 may include the same material. Interfaces between adjacent first insulating layers 101 may not be distinguished. For example, the plurality of first insulating layers 101 may include different materials. Interfaces between adjacent first insulating layers 101 may be distinguished.

The first redistribution substrate 100 may further include under bump patterns 120. The under bump patterns 120 may be provided in the lowermost first insulating layer 101. Bottom surfaces of the under bump patterns 120 may not be covered by the lowermost first insulating layer 101. The under bump patterns 120 may function as pads of the solder balls 500. The under bump patterns 120 may be laterally spaced apart from one another and may be electrically insulated from one another. When two components are laterally spaced apart, it may indicate that they are horizontally spaced apart. "Horizontal" may indicate being parallel to a bottom surface of the first redistribution substrate 100. The bottom surface of the first redistribution substrate 100 may include a bottom surface of the lowermost first insulating layer 101 and the bottom surfaces of the under bump patterns 120. The under bump patterns 120 may include a metal material such as copper.

The first redistribution patterns 130 may be provided on the under bump patterns 120 and may be electrically connected to the under bump patterns 120. The first redistribution patterns 130 may be laterally spaced apart from one another and may be electrically separated from one another. The first redistribution patterns 130 may be provided in the first insulating layers 101. The first redistribution patterns 130 may include a metal such as copper. An electrical connection to the first redistribution substrate 100 may include an electrical connection to one of the first redistribution patterns 130. The electrical connection of the two components to each other may include a direct connection or an indirect connection through another component.

Each of the first redistribution patterns 130 may include a first via part and a first wiring part. In the present disclosure, a via part of a component may be a part for vertical connection, and a wiring part may be a part for horizontal connection. "Vertical" may indicate being perpendicular to the bottom surface of the first redistribution substrate 100. The first via part may be provided in the corresponding first insulating layer 101. The first wiring part may be provided on the first via part and may be connected to the first via part without an interface.

The first redistribution patterns 130 may include first lower redistribution patterns and first upper redistribution patterns. The first upper redistribution patterns may be disposed on the first lower redistribution patterns and may be connected to the first lower redistribution patterns, respectively. The number of the first redistribution patterns 130 stacked between the under bump patterns 120 and the first redistribution pads 150 is not limited to the drawings shown and may be variously modified.

The first seed patterns 135 may be respectively disposed on bottom surfaces of the first redistribution patterns 130. For example, each of the first seed patterns 135 may cover the bottom surface and the sidewall of the first via part of the corresponding first redistribution pattern 130 and a bottom surface of the first wiring part. Each of the first seed patterns 135 may not extend on the sidewall of the first wiring part of the corresponding first redistribution pattern 130. The first seed patterns 135 may include a material different from that of the under bump patterns 120 and the first redistribution patterns 130. For example, the first seed patterns 135 may include a conductive seed material. The conductive seed material may include copper, titanium, and/or alloys thereof.

The first seed patterns 135 may function as barrier layers to prevent diffusion of a material included in the first redistribution patterns 130.

The first redistribution pads 150 may be disposed on the first redistribution patterns 130 to connect to the first redistribution patterns 130. The first redistribution pads 150 may be laterally spaced apart from one another. Each of the first redistribution pads 150 may be connected to a corresponding under bump pattern 120 through the first upper redistribution pattern and the first lower redistribution pattern. The first redistribution patterns 130 may be provided, and thus the at least one first redistribution pad 150 may not be vertically aligned with the under bump pattern 120 electrically connected thereto. Accordingly, the arrangement of the first redistribution pads 150 may be designed more freely.

The first redistribution pads 150 may be provided in the uppermost first insulating layer 101 and extend onto a top surface of the uppermost first insulating layer 101. A lower part of each of the first redistribution pads 150 may be disposed in the uppermost first insulating layer 101. An upper part of each of the first redistribution pads 150 may be provided on the lower part and may be connected to the lower part without an interface. The upper part of each of the first redistribution pads 150 may extend to the top surface of the uppermost first insulating layer 101.

First seed pads 155 may be respectively provided on bottom surfaces of the first redistribution pads 150. As shown in FIG. 1A, the first seed pads 155 may be respectively provided between the upper redistribution patterns of the first redistribution patterns 130 and the first redistribution pads 150, and may extend between the uppermost first insulating layer 101 and the first redistribution pads 150. The first seed pads 155 may include a material different from that of the first redistribution pads 150. The first seed pads 155 may include, for example, a conductive seed material.

The solder balls 500 may be disposed on the bottom surface of the first redistribution substrate 100. For example, the solder balls 500 may be respectively disposed on the bottom surfaces of the under bump patterns 120 to be respectively connected to the under bump patterns 120. The solder balls 500 may be electrically connected to the first redistribution patterns 130 through the under bump patterns 120. The solder balls 500 may be electrically separated from one another. The solder balls 500 may include a solder material. The solder material may include, for example, tin, bismuth, lead, silver, or alloys thereof. The solder balls 500 may include a signal solder ball, a ground solder ball, and a power solder ball.

The semiconductor chip 200 may be mounted on a top surface of the first redistribution substrate 100. The semiconductor chip 200 may be disposed on the center region of the first redistribution substrate 100 in a plan view. The semiconductor chip 200 may be one of a logic chip, a buffer chip, and a memory chip. For example, the semiconductor chip 200 may be a logic chip. The semiconductor chip 200 may include an ASIC chip or an application processor (AP) chip. The ASIC chip may include an application specific integrated circuit (ASIC). As another example, the semiconductor chip 200 may include a central processing unit (CPU) or a graphics processing unit (GPU).

The semiconductor chip 200 may have top and bottom surfaces opposite to each other. The bottom surface of the semiconductor chip 200 may face the first redistribution substrate 100 and may be an active surface. The top surface of the semiconductor chip 200 may be an inactive surface. For example, the semiconductor chip 200 may include a semiconductor substrate, integrated circuits, a wiring layer, and chip pads 230. The semiconductor substrate may include silicon, germanium, and/or silicon-germanium. The semiconductor substrate may be a silicon wafer. The integrated circuits may be adjacent to each other in the semiconductor chip 200. The chip pads 230 may be provided on the bottom surface of the semiconductor chip 200. The wiring layer may be provided between the integrated circuits and the chip pads 230. The chip pads 230 may be connected to the integrated circuits through the wiring layer. When a component is electrically connected to the semiconductor chip 200, it may indicate that it is electrically connected to the integrated circuits of the semiconductor chip 200 through the chip pads 230 of the semiconductor chip 200. The chip pads 230 may include a metal such as aluminum, copper, and/or a combination thereof.

As another example, the semiconductor chip 200 may include a plurality of lower chips. The lower chips may be horizontally spaced apart from one another. Alternatively, the lower chips may be vertically stacked on the first redistribution substrate 100. Hereinafter, a single semiconductor chip 200 is illustrated and described for convenience, but example embodiments are not limited thereto.

The semiconductor package 10 may further include conductive bumps 250. The conductive bumps 250 may be interposed between the first redistribution substrate 100 and the semiconductor chip 200. For example, the conductive bumps 250 may be provided between the corresponding first redistribution pads 150 and the chip pads 230 and may be connected to the first redistribution pads 150 and the chip pads 230. Accordingly, the semiconductor chip 200 may be connected to the first redistribution substrate 100 through the conductive bumps 250. The conductive bumps 250 may include solder balls. The conductive bumps 250 may include a solder material. The conductive bumps 250 may further include pillar patterns, and the pillar patterns may include a metal such as copper.

The semiconductor package 10 may further include an underfill layer 410. The underfill layer 410 may be provided in a gap region between the first redistribution substrate 100 and the semiconductor chip 200, and may cover sidewalls of the conductive bumps 250. The underfill layer 410 may include an insulating polymer such as an epoxy polymer.

The conductive structures 350 may be disposed on the top surface of the first redistribution substrate 100 to connect to a corresponding one of the redistribution pads 150. Accordingly, the conductive structures 350 may be connected to the first redistribution substrate 100. The conductive structures 350 may be electrically connected to the solder balls 500 or the semiconductor chip 200 through the first redistribution substrate 100. Metal pillars may be provided on the first redistribution substrate 100 to form conductive structures 350. That is, the conductive structures 350 may be metal pillars.

The conductive structures 350 may be laterally spaced apart from the semiconductor chip 200. The conductive structures 350 may be laterally spaced apart from each other. The conductive structures 350 may be disposed on an edge region of the first redistribution substrate 100 in a plan view. The edge region of the first redistribution substrate 100 may be provided between the center region and sidewalls of the first redistribution substrate 100 in a plan view. The edge region of the first redistribution substrate 100 may surround the center region in a plan view.

The conductive structures 350 may include signal carrying conductive structures and voltage supply conductive structures. The voltage may be a power supply voltage or a ground voltage.

A molding layer 400 may be provided on the top surface of the first redistribution substrate 100 and may cover the semiconductor chip 200. The molding layer 400 may further cover sidewalls of the conductive structures 350. The molding layer 400 may be interposed between the semiconductor chip 200 and the conductive structures 350. The molding layer 400 may include an insulating polymer such as an epoxy-based polymer.

The second redistribution substrate 600 may be disposed on the semiconductor chip 200, the molding layer 400, and the conductive structures 350. The second redistribution substrate 600 may include a second insulating layer 601, second redistribution patterns 630, second seed patterns 635, a first dummy conductive pattern 641, a second dummy conductive pattern 642, a third dummy conductive pattern 643, a second redistribution pad 650, and a marking metal layer 660.

The second insulating layer 601 may cover a top surface of the molding layer 400. The second insulating layer 601 may be an organic insulating layer. For example, the second insulating layer 601 may include an organic material such as a photo-imageable dielectric (PID) material. As another example, the second insulating layer 601 may include a solder resist material or an Ajinomoto build-up film. The second redistribution substrate 600 may include a plurality of second insulating layers 601. The second insulating layers 601 may be stacked on the molding layer 400. The second insulating layers 601 may include the same material. The second insulating layers 601 may include different materials. An interface between the second insulating layers 601 adjacent to each other may not be distinguished, but is not limited thereto. For example, an interface between the second insulating layers 601 adjacent to each other may be distinguished. The number of the second insulating layers 601 may be variously modified. The second insulating layers 601 may be transparent.

The second redistribution patterns 630 may be laterally spaced apart from one another and may be electrically separated from one another. Each of the second redistribution patterns 630 may include a second via part and a second wiring part. The second via part of each of the second redistribution patterns 630 may be provided in a corresponding second insulating layer 601. The second wiring part of each of the second redistribution patterns 630 may be provided between the second insulating layers 601. The second via part of each of the second redistribution patterns 630 may be connected to the second wiring part without an interface. The second redistribution patterns 630 may include a metal such as copper.

The second redistribution patterns 620 may include second lower redistribution patterns 631 and second upper redistribution patterns 632. The second lower redistribution patterns 631 may be provided in an edge region of the second redistribution substrate 600 in a plan view. The second lower redistribution patterns 631 may be disposed on the conductive structures 350 to connect to the conductive structures 350.

The second upper redistribution patterns 632 may be disposed on the second lower redistribution patterns 631 and may be connected to the second lower redistribution patterns 631. The second upper redistribution patterns 632 may be connected to the conductive structures 350 through the second lower redistribution patterns 631. As illustrated in FIGS. 1A and 1B, the second upper redistribution patterns 632 may be provided in an edge region of the second redistribution substrate 600 in a plan view. The edge region of the second redistribution substrate 600 may be provided between side surfaces of the second redistribution substrate 600 and a center region of the second redistribution substrate 600 in a plan view.

The second redistribution patterns 630 may include signal redistribution patterns and voltage supply redistribution patterns. For example, the signal redistribution patterns may function as data signal transmission paths between the first redistribution substrate 100 and the second redistribution pads 650. The voltage supply redistribution patterns may function as voltage supply paths between the first redistribution substrate 100 and the second redistribution pads 650. The voltage may be a power supply voltage or a ground voltage. That is, the voltage supply redistribution patterns may include a ground voltage supply redistribution pattern and a power supply voltage supply redistribution pattern. The voltage supply redistribution patterns may be insulated from the signal redistribution patterns.

The second seed patterns 635 may be respectively disposed on bottom surfaces of the second redistribution patterns 630. For example, each of the second seed patterns 635 may be provided on a bottom surface and a side surface of the second via of the corresponding second redistribution pattern 620, and may extend onto a bottom surface of the second wiring. The second seed patterns 635 may include a material different from that of the conductive structures 350 and the second redistribution patterns 630. For example, the second seed patterns 635 may include a conductive seed material. The second seed patterns 635 may function as barrier layers to prevent diffusion of a material included in the second redistribution patterns 630.

The second redistribution pads 650 may be disposed on the second upper redistribution patterns 632 to respectively connect to the second upper redistribution patterns 632. The second redistribution pads 650 may be laterally spaced apart from one another. As illustrated in FIGS. 1A and 1B, the second redistribution pads 650 may be provided in an edge region of the second redistribution substrate 600 in a plan view. As illustrated in FIG. 1D, the second redistribution pads 650 may be electrically connected to the conductive structures 350 through the second redistribution patterns 630. Thus, the second redistribution patterns 630 may be provided to electrically connect second redistribution pads 650 to the conductive structures 350 even when the second redistribution pads 650 are not vertically aligned with the conductive structure 350. Accordingly, the arrangement of the second redistribution pads 650 may be designed more freely.

A lower part of each of the second redistribution pads 650 may be provided in the uppermost second insulating layer 601. An upper part of each of the second redistribution pads 650 may extend onto a top surface of the uppermost second insulating layer 601. The upper part of each of the second redistribution pads 650 may have a greater width than the lower part of each of the second redistribution pads 650. A top surface of each of the second redistribution pads 650 may be exposed through the uppermost second insulating layer 601. The second redistribution pads 650 may include, for example, a metal such as copper.

The number of the second redistribution patterns 630 that are stacked may be variously modified. For example, the second lower redistribution patterns 631 may be omitted, and the second upper redistribution patterns 632 may be disposed on the conductive structures 350. As another example, second intermediate redistribution patterns may be further provided between the second lower redistribution patterns 631 and the second upper redistribution patterns 632.

An outer wall of the second redistribution substrate 600 may be aligned with an outer wall of the molding layer 400 and an outer wall of the first redistribution substrate 100. The second redistribution substrate 600 may be electrically connected to the conductive structures 350. An electrical connection to the second redistribution substrate 600 may include an electrical to at least one of the second redistribution patterns 630.

The first dummy conductive pattern 641, the second dummy conductive pattern 642, and the third dummy conductive pattern 643 may be provided between the second insulating layers 601. One second insulating layer 601 may cover a top surface of the first dummy conductive pattern 641, a top surface of the second dummy conductive pattern 642, and a top surface of the third dummy conductive pattern 643. As illustrated in FIGS. 1A and 1B, the first to third dummy conductive patterns 641, 642, and 643 may be provided in the center region of the second redistribution substrate 600 in a plan view. The first to third dummy conductive patterns 641, 642, and 643 may be spaced apart from the second redistribution patterns 630. For example, the first to third dummy conductive patterns 641, 642, and 643 may be horizontally spaced apart from the second upper redistribution patterns 632. The first to third dummy conductive patterns 641, 642, and 643 may be insulated from the second redistribution patterns 630 and from each other. A thickness of each of the first to third dummy conductive patterns 641, 642, and 643 may be substantially the same as a thickness of the second upper redistribution patterns 632. The same thicknesses, levels, and intervals of certain components may error ranges that may occur during a process. As another example, at least one of the first dummy conductive pattern 641, the second dummy conductive pattern 642, and the third dummy conductive pattern 643 may be electrically connected to the second redistribution patterns 630.

The first dummy conductive pattern 641 may be provided between the second dummy conductive pattern 642 and the third dummy conductive pattern 643. As shown in FIG. 1B, the first dummy conductive pattern 641 may have inner walls facing the second dummy conductive pattern 642 and outer walls facing the third dummy conductive pattern 643. For example, inner walls of the second dummy conductive pattern 642 may have a rectangular shape in a plan view. Outer walls of the second dummy conductive pattern 642 may have a rectangular shape in a plan view. The shapes of the inner and outer walls of the second dummy conductive pattern 642 are not limited to the drawings shown and may be variously modified. For example, each of the outer and inner walls of the second dummy conductive pattern 642 may have a circular or polygonal shape.

The second dummy conductive pattern 642 may be horizontally spaced apart from the first dummy conductive pattern 641. For example, the second dummy conductive pattern 642 may be horizontally spaced apart from the outer walls of the first dummy conductive pattern 641. The first dummy conductive pattern 641 and the second dummy conductive pattern 642 may be spaced apart from each other by a first interval A1. The first interval A1 may be, for example, 1 µm to 5 mm. The second dummy conductive pattern 642 may be surrounded by the first dummy conductive pattern 641 in a plan view as shown in FIG. 1B. First holes 641H may be formed through the second dummy conductive pattern 642. The first holes 641H may pass through top and bottom surfaces of the second dummy conductive pattern 642. The first holes 641H may function as passages through which impurities are discharged in a base state in a process of forming the second dummy conductive pattern 642. The base state is defined as a state in which by-products or impurities generated while forming the second dummy conductive pattern 642 remain. The shape and planar arrangement of the first holes 641H may be variously modified. The second insulating layer 601 may pass through and fill the first holes 641H, and in this regard the adjacent second insulating layers 601 may directly contact each other through the first holes 641H.

The third dummy conductive pattern 643 may be interposed between the first dummy conductive pattern 641 and the second upper redistribution patterns 632. The third dummy conductive pattern 643 may be horizontally spaced apart from the second dummy conductive pattern 642 and the second upper redistribution patterns 632. For example, the third dummy conductive pattern 643 may be horizontally spaced apart from the outer walls of the second dummy conductive pattern 642. A second interval A2 between the second dummy conductive pattern 642 and the third dummy conductive pattern 643 may be, for example, 1 µm to 5 mm. The third dummy conductive pattern 643 may surround the first dummy conductive pattern 641 in a plan view as shown in FIG. 1B. Second holes 643H may be formed through the third dummy conductive pattern 643. The second holes 643H may pass through top and bottom surfaces of the third dummy conductive pattern 643. The second holes 643H may function as passages through which impurities are discharged in a base state in a process of forming the third dummy conductive pattern 643. The base state is defined as a state in which by-products or impurities generated while forming the third dummy conductive pattern 643 remain. The shape and planar arrangement of the second holes 643H may be variously modified. The second insulating layer 601 may pass through and fill the second holes 643H, and in this regard the adjacent second insulating layers 601 may directly contact each other through the second holes 643H.

The first to third dummy conductive patterns 641, 642, and 643 may include a metal such as copper. As another example, the first to third dummy conductive patterns 641, 642, and 643 may include tungsten or aluminum. Thermal expansion coefficients of the first to third dummy conductive patterns 641, 642, and 643 may be different from that of the second insulating layers 601. For example, the thermal expansion coefficients of the first to third dummy conductive patterns 641, 642, and 643 may be greater than that of the second insulating layers 601.

The marking metal layer 660 may be provided on the second dummy conductive pattern 642. For example, the marking metal layer 660 may be provided on the top surface of the uppermost second insulating layer 601. As shown in FIG. 1C, the marking metal layer 660 may be provided on the center region of the second redistribution substrate 600. The marking metal layer 660 may be horizontally spaced apart from the second redistribution pads 650. The marking metal layer 660 may be electrically insulated from the second redistribution pads 650, the second redistribution patterns 630, and the first to third dummy conductive patterns 641, 642, and 643. The marking metal layer 660 may include a marking part MK. The marking part MK may be provided on a top surface of the marking metal layer 660. The marking part MK may indicate information about the semiconductor package 10. The top surface of the marking metal layer 660 may not be covered by the uppermost second insulating layer 601, and thus the marking part MK may be exposed.

As another example, the marking metal layer 660 may be electrically connected to at least one of the second redistribution pads 650, the second redistribution patterns 630, and the first to third dummy conductive patterns 641, 642, and 643.

A thermal expansion coefficient of the marking metal layer 660 may be different from a thermal expansion coefficient of the second insulating layers 601. The thermal expansion coefficient of the marking metal layer 660 may be greater than that of the second insulating layers 601. As shown in FIG. 1F, when the second redistribution substrate 600 does not include the first to third dummy conductive patterns 641, 642, and 643, stress due to a difference in the thermal expansion coefficients between the second insulating layers 601 and the marking metal layer 660 may be concentrated on the edge region of the marking metal layer 660. Cracks CR may be formed in the second redistribution substrate 600 by the stress. The crack CR may be formed in the uppermost second insulating layer 601, and may overlap the edge region of the marking metal layer 660 or may be adjacent to the edge region of the marking metal layer 660. The second redistribution substrate 600 may be damaged by the crack CR.

According to example embodiments, as shown in FIGS. 1A, 1D, and 1E, the first dummy conductive pattern 641 may be provided on a bottom surface of the edge region of the marking metal layer 660. For example, sidewalls of the marking metal layer 660 may vertically overlap the first dummy conductive pattern 641. The first dummy conductive pattern 641 may include a first part and a second part. The first part of the first dummy conductive pattern 641 may overlap the marking metal layer 660 in a plan view. The second part of the first dummy conductive pattern 641 may be spaced apart from the marking metal layer in a plan view. The second part of the first dummy conductive pattern 641 may be connected to the first part without an interface.

The first dummy conductive pattern 641 may have a larger thermal expansion coefficient than that of the second insulating layers 601. The difference in the thermal expansion coefficients between the marking metal layer 660 and the second insulating layers 601 may be offset or dispersed by the difference in the thermal expansion coefficients between the first dummy conductive pattern 641 and the second insulating layers 601. Accordingly, a phenomenon in which stress due to the difference in the thermal expansion coefficients between the second insulating layers 601 and the marking metal layer 660 is concentrated on the marking metal layer 660 may be prevented.

When one of the second dummy conductive pattern 642 and the third dummy conductive pattern 643 is omitted, a stress the difference in the thermal expansion coefficient between the first dummy conductive pattern 641 and the second insulating layers 601 may be applied to the first dummy conductive pattern 641. In some example embodiments, the second dummy conductive pattern 642 and the third dummy conductive pattern 643 may be provided on both sides of the first dummy conductive pattern 641, respectively. Each of the thermal expansion coefficient of the second dummy conductive pattern 642 and the thermal expansion coefficient of the third dummy conductive pattern 643 may be greater than the thermal expansion coefficient of the second insulating layers 601. Stress due to the difference in the thermal expansion coefficients between the first dummy conductive pattern 641 and the second insulating layers 601 on inner walls of the first dummy conductive pattern 641 may be offset or dispersed by the stress due to the difference in the thermal expansion coefficients between the second dummy conductive pattern 642 and the second insulating layers 601. Accordingly, a phenomenon in which stress is concentrated on the inner walls of the first dummy conductive pattern 641 may be prevented. When the first interval A1 is less than 1 µm, the stress may be applied to the inner walls of the first dummy conductive pattern 641. In some example embodiments, when the first interval A1 is 1 µm or more, the phenomenon in which the stress is concentrated on the inner walls of the first dummy conductive pattern 641 may be further prevented.

Stress due to a difference in thermal expansion coefficients between the first dummy conductive pattern 641 and the second insulating layers 601 on the outer walls of the first dummy conductive pattern 641 may be offset or dispersed by stress due to a difference in thermal expansion coefficients between the third dummy conductive pattern 643 and the second insulating layers 601. Accordingly, a phenomenon in which stress is concentrated on the outer walls of the first dummy conductive pattern 641 may be prevented. In some example embodiments, when the second interval A2 is 1 µm or more, the phenomenon in which the stress is concentrated on the outer walls of the first dummy conductive pattern 641 may be further prevented.

According to example embodiments, although an operation of the semiconductor package 10 is repeated, a phenomenon in which a crack (CR of FIG. 1F) is formed in the second redistribution pattern 630 may be prevented. The operation is defined as a series of operation processes in a general device into which the semiconductor package 10 is inserted. Accordingly, durability and reliability of the semiconductor package 10 may be improved.

When the first interval A1 is greater than 500 µm or the second interval A2 is greater than 500 µm, a size of the semiconductor package 10 may be excessively increased. According to example embodiments, the first interval A1 may be between 1 µm and 500 µm, and the second interval A2 may be between 1 µm and 500 µm. Accordingly, the semiconductor package 10 may be miniaturized and the phenomenon in which stress is concentrated on the outer walls of the first dummy conductive pattern 641 may be prevented.

Hereinafter, with reference to FIG. 1E, the first to third dummy conductive patterns 641, 642, and 643, the marking metal layer 660, and the second redistribution pads 650 according to example embodiments will be described in more detail.

As shown in FIG. 1E, the second redistribution substrate 600 may further include dummy seed patterns 645. Dummy seed patterns 645 may be respectively disposed on the bottom surfaces of the first to third dummy conductive patterns 641, 642, and 643. The dummy seed patterns 645 may include a conductive seed material. The dummy seed patterns 645 may include a metal material different from that of the first to third dummy conductive patterns 641, 642, and 643. For example, the dummy seed patterns 645 may include titanium or an alloy of titanium and copper. A thickness of the dummy seed patterns 645 may be smaller than the thicknesses of the first to third dummy conductive patterns 641, 642, and 643. The dummy seed patterns 645 may include the same material as the second seed patterns 635 and may have substantially the same thickness as the second seed patterns 635. The dummy seed patterns 645 may function as barrier layers to prevent diffusion of metal included in the first to third dummy conductive patterns 641, 642, and 643.

Each of the second redistribution pads 650 may include a second seed pad 655 and a conductive pad 651. The second seed pad 655 may be interposed between the corresponding second upper redistribution pattern 632 and the second redistribution pad 650. The second seed pad 655 may further extend between the corresponding second upper redistribution pattern 632 and the uppermost second insulating layer 601. The second seed pad 655 may include a conductive seed material. The second seed pad 655 may function as a barrier layer to prevent diffusion of metal included in the conductive pad 651.

The conductive pad 651 may be disposed on the second seed pad 655. The conductive pad 651 may include a material different from that of the second seed pad 655. For example, the conductive pad 651 may include copper, and the second seed pad 655 may include titanium or an alloy of titanium and copper. A thickness of the conductive pad 651 may be greater than the thickness of the second seed pad 655.

The marking metal layer 660 may include a marking seed pattern 665 and a metal pattern 661. The marking seed pattern 665 may be disposed on the uppermost second insulating layer 601. The marking seed pattern 665 may include a conductive seed material. For example, the marking seed pattern 665 may include titanium or an alloy of titanium and copper. The marking seed pattern 665 may include the same material as that of the second seed pad 655. The marking seed pattern 665 may have substantially the same thickness as the second seed pad 655. The marking seed pattern 665 may function as a barrier layer to prevent diffusion of metal included in the marking metal layer 660.

The metal pattern 661 may be provided on the marking seed pattern 665. A thickness of the metal pattern 661 may be greater than the thickness of the marking seed pattern 665. The metal pattern 661 may include the same material as the conductive pad 651. The metal pattern 661 may include a material different from that of the marking seed pattern 665. For example, the metal pattern 661 may include copper. Alternatively, the conductive pattern and the marking seed pattern 665 may include the same metal. As another example, the marking metal layer 660 may not include the marking seed pattern 665.

Figure 1G:
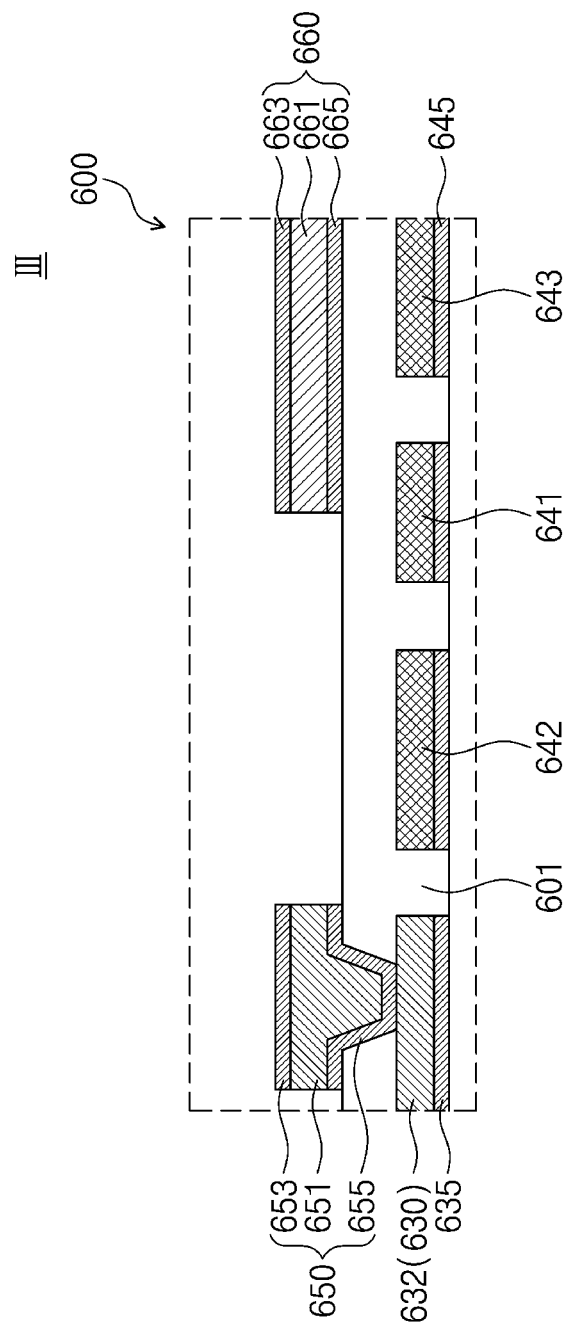
FIG. 1G is a view for illustrating a marking metal layer and a second redistribution pad according to example embodiments.

FIG. 1G is a view for explaining a marking metal layer and a second redistribution pad according to example embodiments and corresponds to an enlarged view of region "III" of FIG. 1D.

Referring to FIG. 1G, each of the second redistribution pads 650 may include a second seed pad 655, a conductive pad 651, and a pad passivation layer 653. The second seed pad 655 and the conductive pad 651 may be substantially the same as described in the example of FIG. 1E. The pad passivation layer 653 may be disposed on a top surface of the conductive pad 651. The pad passivation layer 653 may include a metal different from that of the conductive pad 651. For example, the pad passivation layer 653 may include nickel, gold (Au), or an alloy thereof. The pad passivation layer 653 may be a single layer or multiple layers. A thickness of the pad passivation layer 653 may be smaller than the thickness of the conductive pad 651. The pad passivation layer 653 may prevent damage (e.g., oxidation) of the conductive pad 651.

The marking metal layer 660 may include a marking seed pattern 665, a metal pattern 661, and a marking passivation layer 663. The marking passivation layer 663 may be provided on a top surface of the metal pattern 661. The marking passivation layer 663 may include a metal different from the metal pattern 661. The marking passivation layer 663 may include the same material as the pad passivation layer 653. For example, the pad passivation layer 653 may include nickel, gold (Au), or an alloy thereof. A thickness of the marking passivation layer 663 may be smaller than the thickness of the metal pattern 661. The marking passivation layer 663 may be substantially the same as the thickness of the pad passivation layer 653. The marking passivation layer 663 may prevent damage (e.g., oxidation) of the metal pattern 661. The marking passivation layer 663 may be a single layer or multiple layers. For example, the marking passivation layer 663 may include an adhesive layer and a bonding layer on the adhesive layer. The bonding layer may include a metal different from the adhesive layer. For example, the bonding layer may include gold (Au) and an adhesive layer (Ni). As another example, one of the bonding layer and the adhesive layer may be omitted.

Hereinafter, the marking metal layer according to the example embodiments will be described in more detail.

Figure 2A:
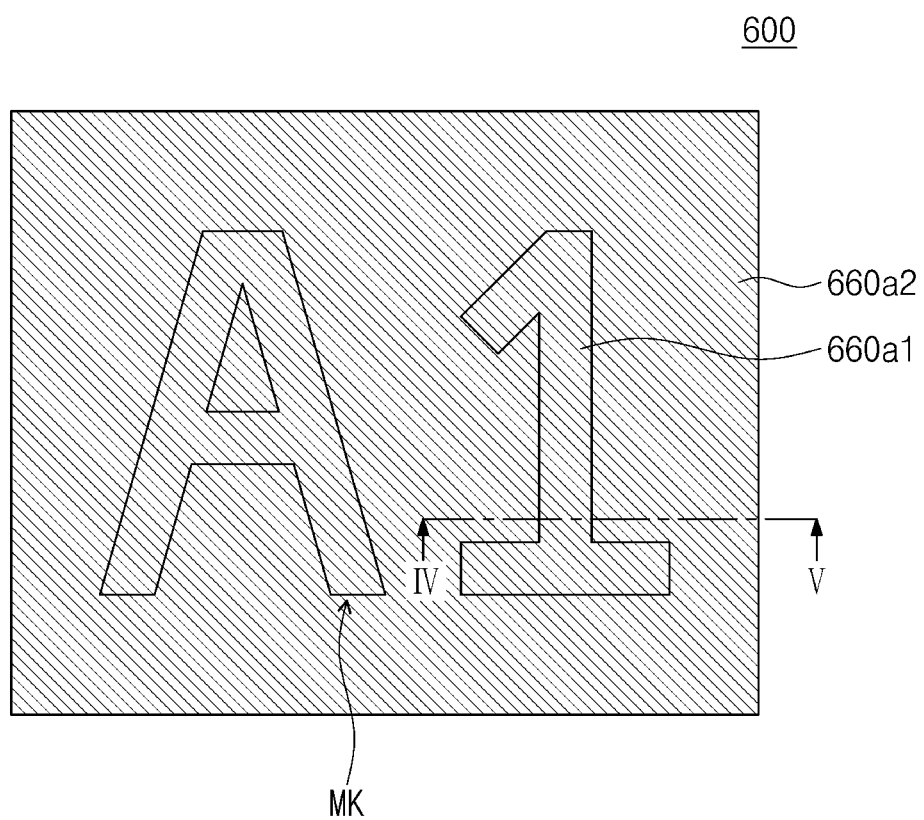
FIG. 2A is a plan view illustrating a marking metal layer according to example embodiments.
Figure 2B:
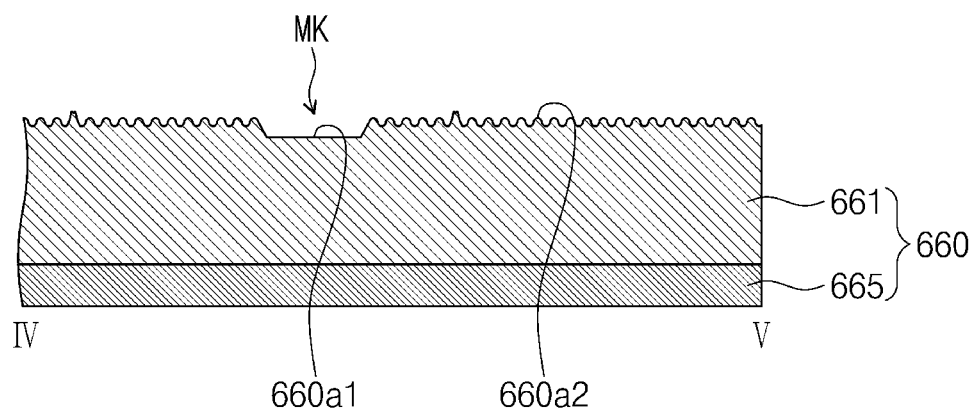
FIG. 2B is a cross-section taken along line IV-V line of FIG. 2A.

FIG. 2A is a plan view illustrating a marking metal layer according to example embodiments. FIG. 2B is a cross-section taken along line IV-V line of FIG. 2A.

Referring to FIGS. 2A and 2B, the marking metal layer 660 may have the marking part MK. The marking part MK may be provided on the top surface of the marking metal layer 660. The marking part MK may be visually distinguishable from other portions of the marking metal layer 660, and may indicate information about the semiconductor package (10 in FIG. 1D) by representing a logo, letters, numbers, and/or barcodes. The marking metal layer 660 may have a first top surface 660a1 and a second top surface 660a2. The first top surface 660a1 of the marking metal layer 660 may have a different roughness from that of the second top surface 660a2. For example, the first top surface 660a1 of the marking metal layer 660 may have a smaller surface roughness than that of the second top surface 660a2. Forming the first top surface 660a1 of the marking metal layer 660 may include melting at least a part of the marking metal layer 660 by, for example, irradiating a laser. The second top surface 660a2 of the marking metal layer 660 may not be exposed to the laser. Accordingly, the first top surface 660a1 of the marking metal layer 660 may be flat, and may have a smaller surface roughness than that of the second top surface 660a2 of the marking metal layer 660. The marking part MK may be marked by a difference in surface roughness of the first top surface 660a1 and the second top surface 660a2 of the marking metal layer 660. For example, the marking part MK may correspond to the first top surface 660a1 of the marking metal layer 660.

The first top surface 660a1 of the marking metal layer 660 may be provided at the same or different level as the second top surface 660a2 of the marking metal layer 660. In the present disclosure, the level may indicate a vertical level, and a level difference may be measured in a direction perpendicular to the bottom surface of the marking metal layer 660.

The marking metal layer 660 may include the marking seed pattern 665 and the metal pattern 661. The first top surface 660a1 and the second top surface 660a2 of the marking metal layer 660 may correspond to the top surface of the metal pattern 661.

Figure 2C:
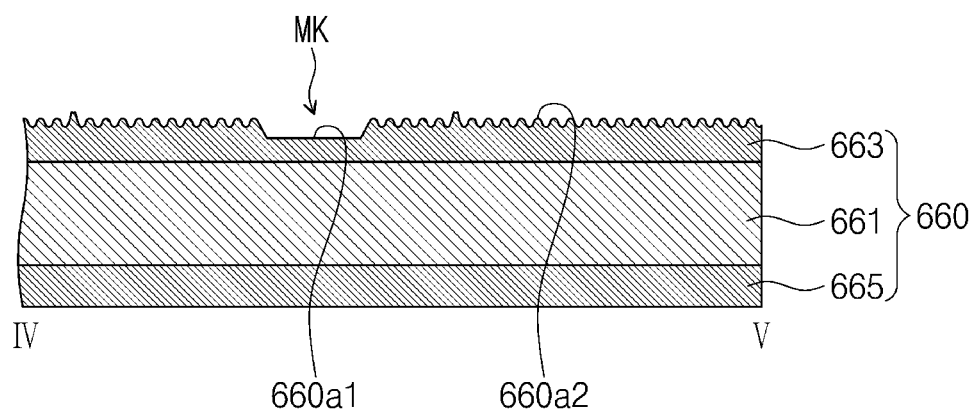
FIG. 2C is a view for illustrating a marking metal layer according to example embodiments.

FIG. 2C is a view for illustrating a marking metal layer according to example embodiments, and corresponds to a cross-section taken along line IV-V of FIG. 2A.

Referring to FIGS. 2A and 2C, the marking metal layer 660 may include the marking seed pattern 665, the metal pattern 661, and the marking passivation layer 663. The first top surface 660a1 and the second top surface 660a2 of the marking metal layer 660 may correspond to the top surface of the marking passivation layer 663. The marking part MK may be provided on the top surface of the marking passivation layer 663. The marking part MK may be visible due to a difference in surface roughness of the first top surface 660a1 and the second top surface 660a2 of the marking metal layer 660.

Figure 2D:
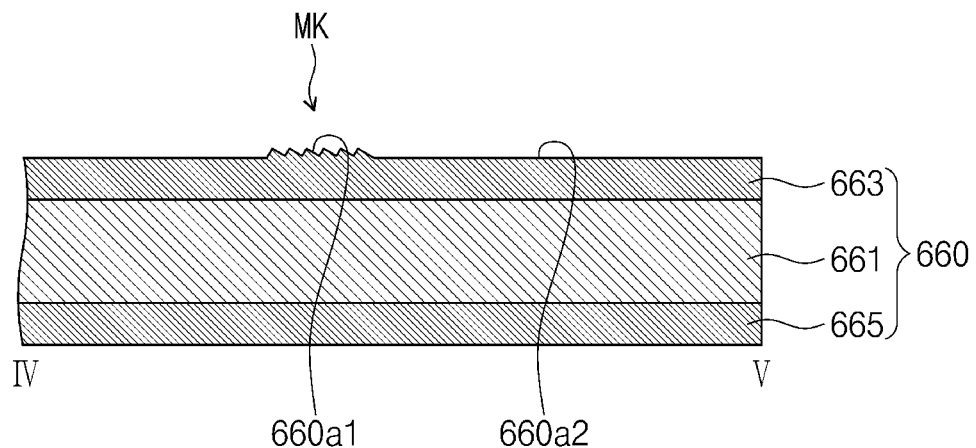
FIG. 2D is a view for illustrating a marking metal layer according to example embodiments.

FIG. 2D is a view for illustrating a marking metal layer according to example embodiments, and corresponds to a cross-section taken along line IV-V of FIG. 2A.

Referring to FIGS. 2A and 2D, the marking metal layer 660 may have the first top surface 660a1 and the second top surface 660a2. The first top surface 660a1 of the marking metal layer 660 may have a greater surface roughness than that of the second top surface 660a2. The first top surface 660a1 of the marking metal layer 660 may be provided at the same or different level as the second top surface 660a2. The marking part MK may be visible due to the difference in surface roughness of the first top surface 660a1 and the second top surface 660a2 of the marking metal layer 660.

The marking metal layer 660 may include the marking seed pattern 665, the metal pattern 661, and the marking passivation layer 663. The first top surface 660a1 and the second top surface 660a2 of the marking metal layer 660 may correspond to the top surface of the marking passivation layer 663. The marking part MK may be provided on the top surface of the marking passivation layer 663.

According to some example embodiments, the marking metal layer 660 may not include the marking passivation layer 663. In this case, the first top surface 660a1 and the second top surface 660a2 of the marking metal layer 660 may be formed on the top surface of the metal pattern 661.

Figure 2E:
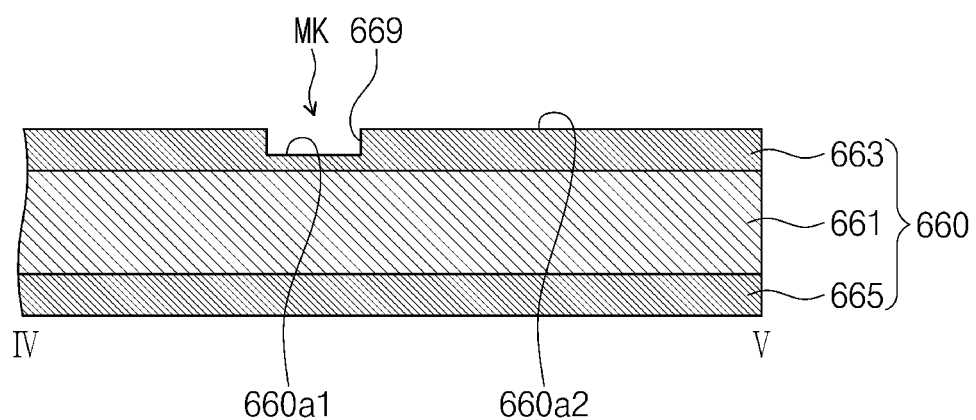
FIG. 2E is a view for illustrating a marking metal layer according to example embodiments.

FIG. 2E is a view for illustrating a marking metal layer according to example embodiments, and corresponds to a cross-section taken along line IV-V of FIG. 2A.

Referring to FIGS. 2A and 2E, the marking metal layer 660 may have the first top surface 660a1 and the second top surface 660a2. The first top surface 660a1 of the marking metal layer 660 may be provided at a level different from that of the second top surface 660a2. For example, the first top surface 660a1 of the marking metal layer 660 may be positioned at a lower level than the second top surface 660a2. A groove 669 may be formed on the second top surface 660a2 of the marking metal layer 660 to form the first top surface 660a1 of the marking metal layer 660. The first top surface 660a1 of the marking metal layer 660 may correspond to a bottom surface of the groove 669. The marking part MK may be visible due to the level difference between the first top surface 660a1 and the second top surface 660a2 of the marking metal layer 660.

As another example, the first top surface 660a1 of the marking metal layer 660 may be positioned at a higher level than the second top surface 660a2. In this case, the second top surface 660a2 of the marking metal layer 660 may correspond to the bottom surface of the groove 669.

The second top surface 660a2 of the marking metal layer 660 may correspond to the top surface of the marking passivation layer 663. The first top surface 660a1 of the marking metal layer 660 may be provided in the marking passivation layer 663. As another example, the groove 669 may further penetrate at least a portion of the metal pattern 661, and the first top surface 660a1 of the marking metal layer 660 may expose the metal pattern 661. As another example, the marking metal layer 660 may not include the marking passivation layer 663, and the first top surface 660a1 and the second top surface 660a2 of the marking metal layer 660 may correspond to the top surface of the metal pattern 661.

Hereinafter, semiconductor packages according to example embodiments will be described.

Figure 3A:
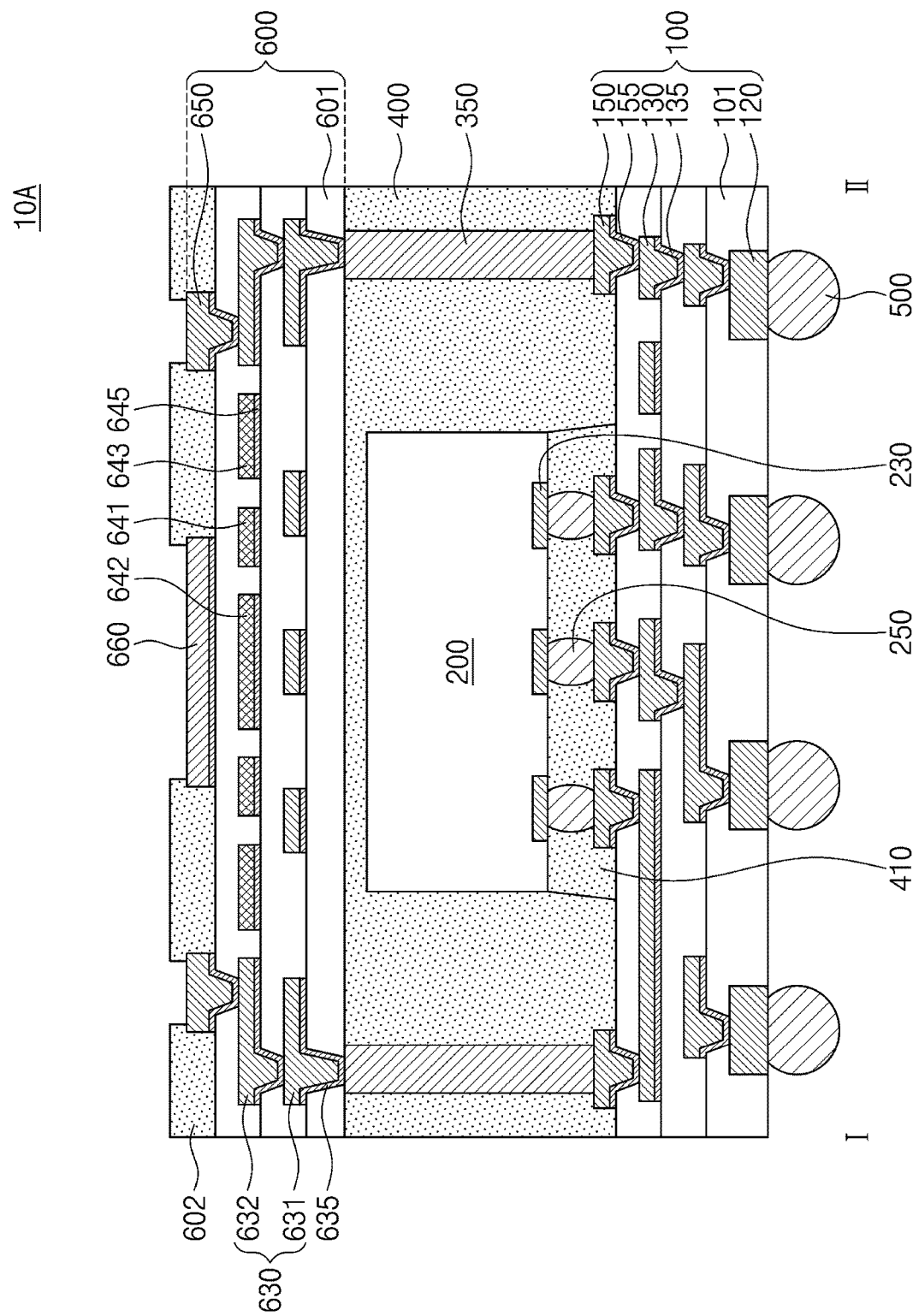
FIG. 3A is a diagram for illustrating a semiconductor package according to example embodiments.

FIG. 3A is a diagram for illustrating a semiconductor package according to example embodiments.

Referring to FIG. 3A, a semiconductor package 10A may be a lower package. The semiconductor package 10A may include the first redistribution substrate 100, the solder balls 500, the semiconductor chip 200, the conductive structures 350, the molding layer 400, and the second redistribution substrate 600.

The second redistribution substrate 600 may include the second insulating layers 601, the second redistribution patterns 630, the second redistribution pads 650, dummy seed patterns 645, the first to third dummy conductive patterns 641, 642, and 643, the marking metal layer 660, and a passivation layer 602. The passivation layer 602 may be provided on the uppermost second insulating layer 601. The passivation layer 602 may further cover sidewalls of the second redistribution pad 650 and sidewalls of the marking metal layer 660. The passivation layer 602 may not cover the top surfaces of the second redistribution pads 650 and the top surface of the marking metal layer 660. For example, the passivation layer 602 may have first upper openings, and the first upper openings may expose the top surfaces of the second redistribution pads 650, respectively. The passivation layer 602 may have second upper openings, and the second upper openings may expose the top surface of the marking metal layer 660. A top surface of the passivation layer 602 may be provided at the same level as or higher than the top surface of the marking metal layer 660 and the top surfaces of the second redistribution pad 650. The passivation layer 602 may include a material different from that of the second insulating layers 601. For example, the passivation layer 602 may include an insulating polymer. The passivation layer 602 may be opaque, but is not limited thereto.

Figure 3B:
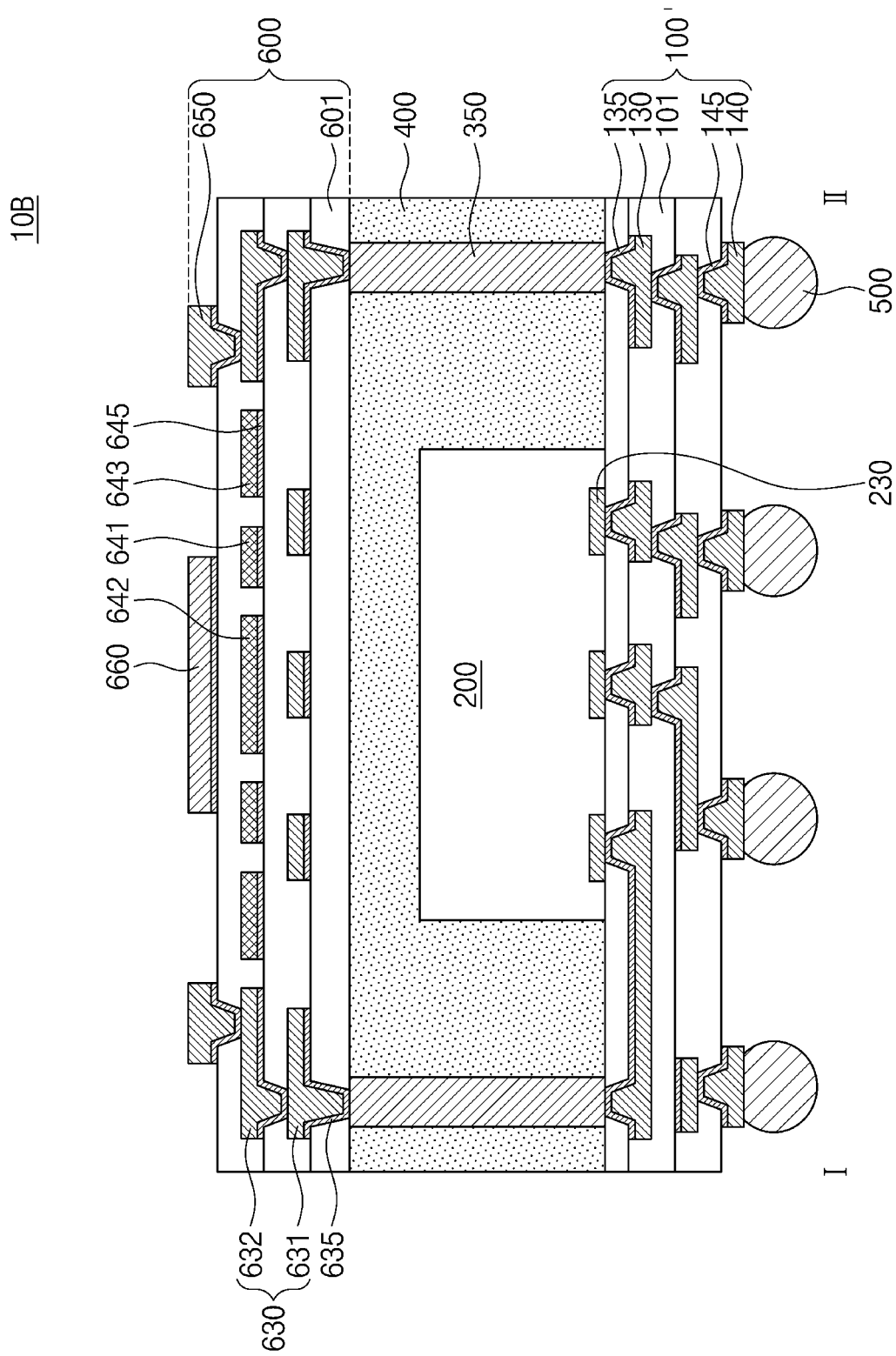
FIG. 3B is a diagram for illustrating a semiconductor package according to example embodiments.

FIG. 3B is a diagram for illustrating a semiconductor package according to example embodiments.

Referring to FIG. 3B, a semiconductor package 10B may be a lower package. The semiconductor package 10B may include a first redistribution substrate 100', the solder balls 500, the semiconductor chip 200, the conductive structures 350, the molding layer 400, and the second redistribution substrate 600. However, the semiconductor package 10A may not include the conductive bumps 250 and the underfill layer 410 described in the example of FIG. 1D.

A first redistribution substrate 100' may include the first insulating layers 101, the first redistribution patterns 130, the first seed patterns 135, first seed pads 145, and first redistribution pads 140. The first redistribution substrate 100' may not include the under bump patterns 120 described in the example of FIG. 1D. The first redistribution substrate 100' may directly contact the semiconductor chip 200 and the molding layer 400. For example, the uppermost first insulating layer 101 may directly contact the bottom surface of the semiconductor chip 200 and a bottom surface of the molding layer 400. The first seed patterns 135 may be respectively provided on top surfaces of the first redistribution patterns 130. The first seed patterns 135 in the uppermost first insulating layer 101 may directly connect to the chip pads 230 or the conductive structures 350. The first via part of each of the uppermost first redistribution patterns 130 may vertically overlap the chip pads 230 or the conductive structures 350.

The first redistribution pads 140 may be provided on the bottom surface of the lowermost first insulating layer 101. The first seed pads 145 may be respectively provided on top surfaces of the first redistribution pads 140. The first redistribution pads 140 may function as pads of the solder balls 500. For example, the solder balls 500 may be provided on the bottom surfaces of the first redistribution pads 140, respectively.

The semiconductor package 10B may be manufactured by a chip-first process, but is not limited thereto.

Figure 3C:
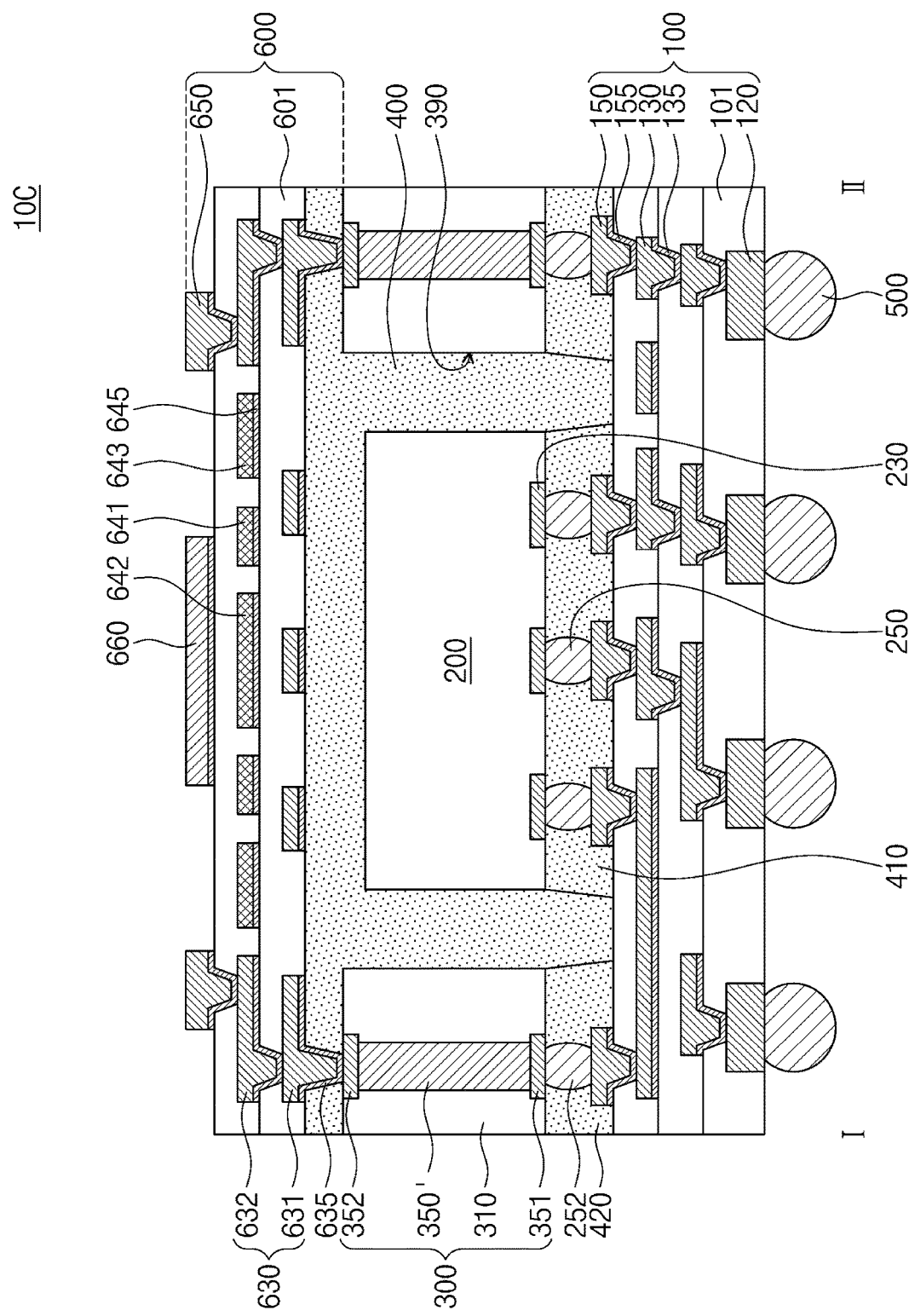
FIG. 3C is a diagram for illustrating a semiconductor package according to example embodiments.

FIG. 3C is a diagram for illustrating a semiconductor package according to example embodiments.

Referring to FIG. 3C, a semiconductor package 10C may be a lower package. The semiconductor package 10C includes the first redistribution substrate 100, the solder balls 500, the semiconductor chip 200, a connection substrate 300, the molding layer 400, and the second redistribution substrate 600.

The first redistribution substrate 100 may be substantially the same as the first redistribution substrate 100 described in the example of FIG. 1D. In this case, the semiconductor package 10C may further include the conductive bumps 250 and the underfill layer 410. As another example, the semiconductor package 10C may include the first redistribution substrate 100' described in the example of FIG. 3B.

The connection substrate 300 may be disposed on the redistribution substrate 100. A substrate hole 390 may penetrate through the connection substrate 300. For example, the connection substrate 300 may be manufactured by forming the substrate hole 390 penetrating top and bottom surfaces of the printed circuit board. In a plan view, the substrate hole 390 may overlap a center portion of the first redistribution substrate 100. The semiconductor chip 200 may be disposed in the substrate hole 390 of the connection substrate 300. The semiconductor chip 200 may be disposed to be spaced apart from an inner wall of the connection substrate 300.

The connection substrate 300 may include conductive structures 350' and a base layer 310. According to some example embodiments, the base layer 310 may include stacked layers. The base layer 310 may include an insulating material. For example, the base layer 310 may include a carbon-based material, a ceramic, or a polymer. The substrate hole 390 may pass through the base layer 310. The conductive structures 350' may be provided in the base layer 310. Each of the conductive structures 350' may be a metal pillar. The connection substrate 300 may further include first pads 351 and second pads 352. The first pads 351 may be disposed on bottom surfaces of the conductive structures 350'. The second pads 352 may be disposed on top surfaces of the conductive structures 350'. The second pads 352 may be electrically connected to the first pads 351 through conductive structures 350'. The conductive structures 350', first pads 351, and second pads 352 may include, for example, a metallic material such as copper, aluminum, tungsten, titanium, tantalum, iron, and alloys thereof.

The semiconductor package 10C may further include connection bumps 252 and an underfill pattern 420. The connection bumps 252 may be disposed between the first redistribution substrate 100 and the connection substrate 300. The connection bumps 252 may be interposed between the first pads 351 and the corresponding redistribution pads 150 to be connected to the first pads 351 and the corresponding redistribution pads 150. The conductive structures 350' may be electrically connected to the first redistribution substrate 100 by connection bumps 252. The connection bumps 252 may include at least one of a solder ball, a bump, and a pillar. The connection bumps 252 may include a solder material. The underfill pattern 420 may be provided in a gap between the first redistribution substrate 100 and the connection substrate 300 to seal the connection bumps 252. The underfill pattern 420 may include an insulating polymer. The underfill pattern 420 may include a material different from that of the molding layer 400, but is not limited thereto.

The molding layer 400 may be provided on the semiconductor chip 200 and the connection substrate 300. The molding layer 400 may extend between the semiconductor chip 200 and the connection substrate 300. According to example embodiments, an adhesive insulating film may be attached to a top surface of the connection substrate 300, the top surface of the semiconductor chip 200, and sidewalls of the semiconductor chip 200, thereby forming the molding layer 400. For example, Ajinomoto Build Up Film (ABF) may be used as the adhesive insulating film. As another example, the molding layer 400 may include an insulating polymer such as an epoxy-based polymer. As another example, the underfill pattern 420 may be omitted, and the molding layer 400 may further extend on a bottom surface of the connection substrate 300. As another example, the underfill layer 410 may be omitted, and the molding layer 400 may further extend on the bottom surface of the semiconductor chip 200.

The second redistribution substrate 600 may be disposed on the molding layer 400 and the connection substrate 300. The second redistribution substrate 600 may be substantially the same as described in the example of FIGS. 1A to 1E, or the example of FIG. 3A. However, the second lower redistribution patterns 631 may extend into the molding layer 400 to be connected to the second pads 352.

Figure 4:
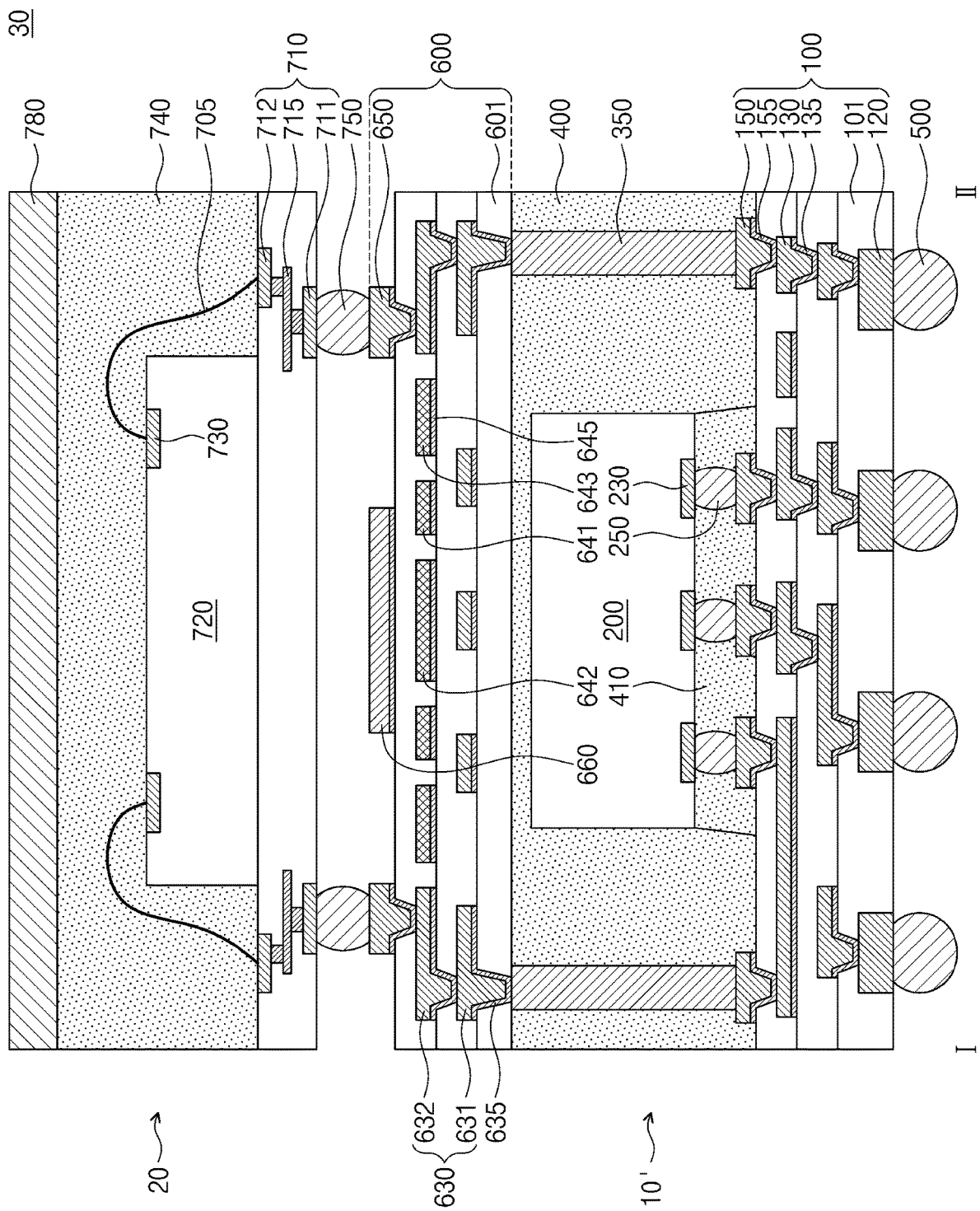
FIG. 4 is a view for illustrating a semiconductor package according to example embodiments.

FIG. 4 is a view for illustrating a semiconductor package according to example embodiments.

Referring to FIG. 4, a semiconductor package 30 may include a lower package 10', an upper package 20, and connection solders 750. The lower package 10' may be substantially the same as the semiconductor package 10 described in the example of FIGS. 1A to 1E. As another example, the lower package 10' may be substantially the same as the semiconductor package 10A of FIG. 3A, the semiconductor package 10B of FIG. 3B, or the semiconductor package 10C of FIG. 3C.

The upper package 20 may include an upper substrate 710, an upper semiconductor chip 720, and an upper molding layer 740. The upper substrate 710 may be disposed on a top surface of the second redistribution substrate 600 and may be spaced apart from the top surface of the second redistribution substrate 600. The upper substrate 710 may be a printed circuit board (PCB) or a redistribution layer. First metal pads 711 and second metal pads 712 may be respectively disposed on a bottom surface and a top surface of the upper substrate 710. Metal wires 715 may be provided in the upper substrate 710 to connect to the first metal pads 711 and the second metal pads 712.

The upper semiconductor chip 720 may be mounted on the upper substrate 710. The upper semiconductor chip 720 may be a semiconductor chip of a different type from that of the semiconductor chip 200. For example, the upper semiconductor chip 720 may be a memory chip, and the semiconductor chip 200 may be a logic chip. As another example, the upper semiconductor chip 720 may include a plurality of upper chips. The upper chips may be horizontally spaced apart from one another. Alternatively, the upper chips may be vertically stacked on the upper substrate 710.

Bonding wires 705 may be provided on a top surface of the upper semiconductor chip 720 to be electrically connected to chip pads 730 and the second metal pads 712 of the upper semiconductor chip 720. The bonding wires 705 may include metal. As another example, the bonding wires 705 may be omitted, and the upper semiconductor chip 720 may be mounted on the upper substrate 710 by a flip-chip method. For example, upper bumps may be provided between the upper substrate 710 and the upper semiconductor chip 720 to be electrically connected to the upper substrate 710 and the upper semiconductor chip 720. In this case, the chip pads 730 of the upper semiconductor chip 720 may be disposed on a bottom surface of the upper semiconductor chip 720.

The upper molding layer 740 may be provided on the upper substrate 710 and may cover the upper semiconductor chip 720. The upper molding layer 740 may further cover the bonding wires 705. The upper molding layer 740 may include an insulating polymer such as an epoxy-based molding compound.

The upper package 20 may further include a heat dissipation structure 780. The heat dissipation structure 780 may be disposed on the top surface of the upper semiconductor chip 720 and a top surface of the upper molding layer 740. The heat dissipation structure 780 may include a heat sink, heat slug, and/or a thermal interface material (TIM) layer. The heat dissipation structure 780 may include, for example, a metal. As another example, the heat dissipation structure 780 may be omitted.

FIGS. 5A to 5K are views for illustrating a method of manufacturing a semiconductor package according to example embodiments, and correspond to cross-sections taken along line I-II of FIG. 1A. Hereinafter, descriptions that overlaps with the above-mentioned descriptions will be omitted. The description of FIGS. 5A to 5K will be described with reference to FIG. 1A.

Figure 5A:
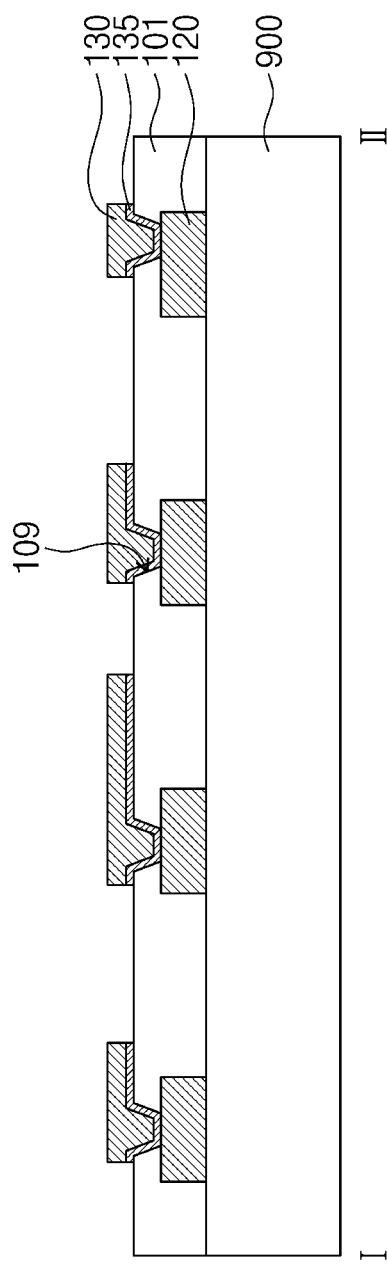
FIGS. 5A, 5B, 5C, 5D, 5E, 5F, 5G, 5H, SI, 5J and 5K are diagrams for illustrating a method of manufacturing a semiconductor package according to example embodiments.

Referring to FIG. 5A, the under bump patterns 120, the first insulating layer 101, the first seed patterns 135, and the first redistribution patterns 130 may be formed on a temporary substrate 900.

According to example embodiments, the under bump patterns 120 may be formed on the temporary substrate 900 by an electroplating process. The first insulating layer 101 may be formed on the temporary substrate 900, and may cover sidewalls and top surfaces of the under bump patterns 120. Openings 109 may be formed in the first insulating layer 101 to expose the under bump patterns 120.

Forming the first seed patterns 135 and the first redistribution patterns 130 may include forming a first seed layer in the openings 109 and on the top surface of the first insulating layer 101, forming a resist layer on the first seed layer, performing an electroplating process using the first seed layer as an electrode, removing the resist layer to expose a part of the first seed layer, and etching the exposed part of the exposed first seed layer.

The first redistribution patterns 130 may be formed in the openings 109 and under the resist layer by the electroplating process. Each of the first redistribution patterns 130 may include the first via part and the first wiring part. The first via part may be formed in the corresponding opening 109. The first wiring part may be formed on the first via part and on the first insulating layer 101. The first seed patterns 135 may be respectively formed on the bottom surfaces of the first redistribution patterns 130 by etching the first seed layer.

Figure 5B:
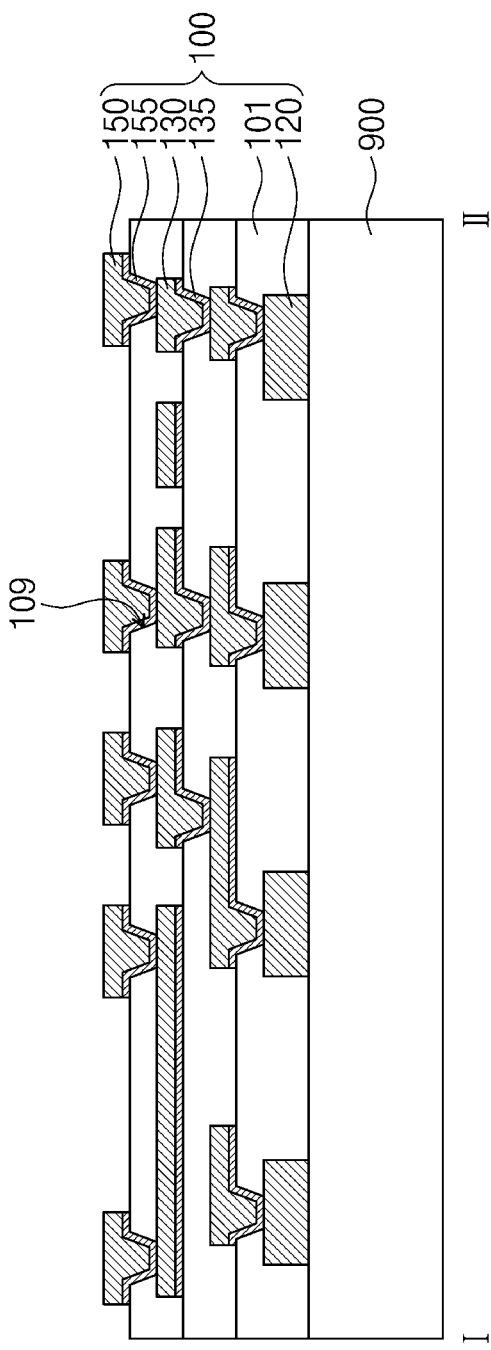

Referring to FIG. 5B, forming the first insulating layer 101, forming the first seed patterns 135, and forming the first redistribution patterns 130 may be repeatedly performed. Accordingly, stacked first insulating layers 101 and stacked first redistribution patterns 130 may be formed. The first seed patterns 135 may be respectively formed on the bottom surfaces of the first redistribution patterns 130.

The first seed pads 155 may be respectively formed in the openings 109 of the uppermost first insulating layer 101. The first seed pads 155 may further extend on the top surface of the uppermost first insulating layer 101. An electroplating process using the first seed pads 155 as electrodes may be performed to form the first redistribution pads 150. The first redistribution pads 150 may fill the openings 109 of the uppermost first insulating layer 101. The first redistribution pads 150 may be connected to the corresponding first redistribution patterns 130. Accordingly, the first redistribution substrate 100 may be manufactured. The first redistribution substrate 100 may include the first insulating layers 101, the under bump patterns 120, the first seed patterns 135, the first redistribution patterns 130, the first seed pads. 155, and the first redistribution pads 150.

Figure 5C:
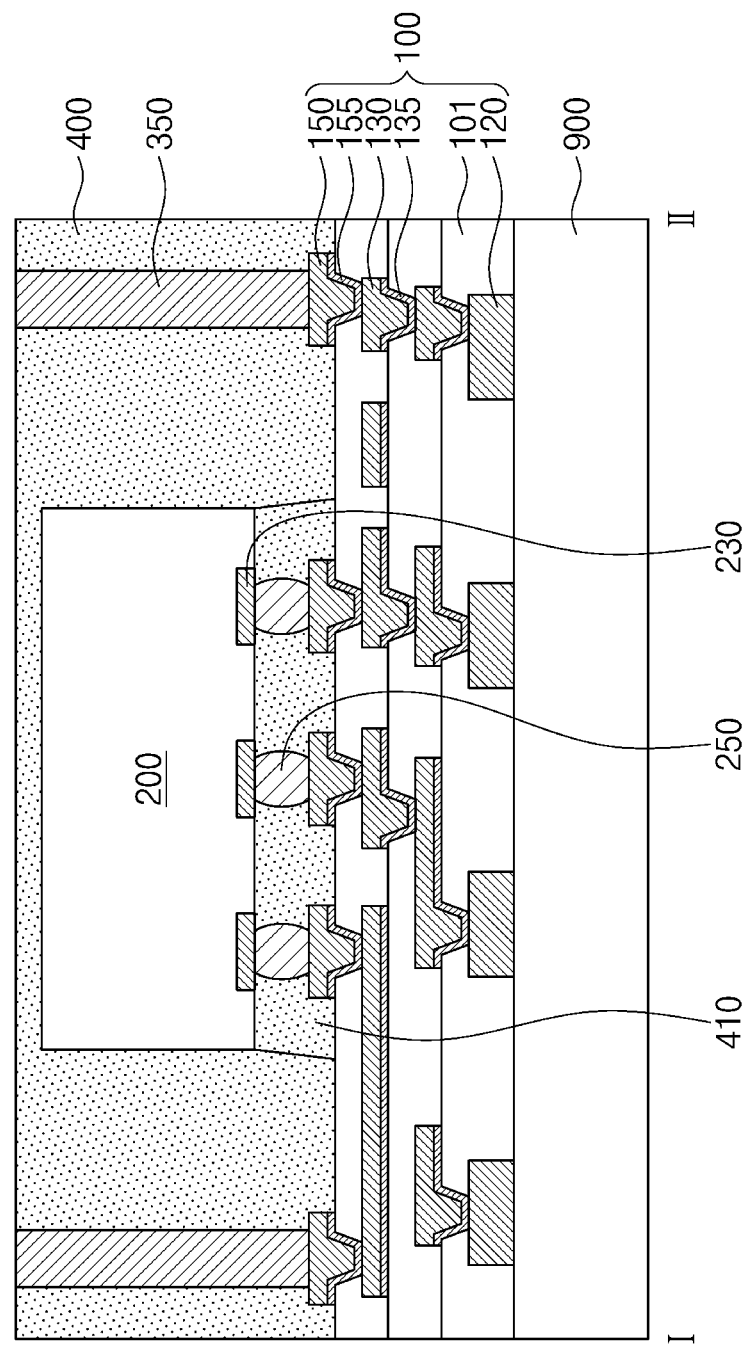

Referring to FIG. 5C, the conductive structures 350 may be formed on the top surface of the edge region of the first redistribution substrate 100. For example, the conductive structures 350 may be provided on the corresponding first redistribution pads 150 to be connected to the first redistribution pads 150. The conductive structures 350 may be formed by an electroplating process, but is not limited thereto.

The semiconductor chip 200 may be mounted on the top surface of the center region of the first redistribution substrate 100. Mounting the semiconductor chip 200 may include forming the conductive bumps 250 between the first redistribution substrate 100 and the semiconductor chip 200. The conductive bumps 250 may connect to the corresponding first redistribution pads 150 and the chip pads 230. Accordingly, the semiconductor chip 200 may be connected to the first redistribution substrate 100 through the conductive bumps 250. The underfill layer 410 may be further formed between the first redistribution substrate 100 and the semiconductor chip 200.

The molding layer 400 may be formed on the top surface of the first redistribution substrate 100, and may cover the semiconductor chip 200. The molding layer 400 may cover sidewalls of the conductive structures 350 and expose top surfaces of the conductive structures 350. For example, the top surface of the molding layer 400 may be provided at substantially the same level as the top surfaces of the conductive structures 350.

Figure 5D:
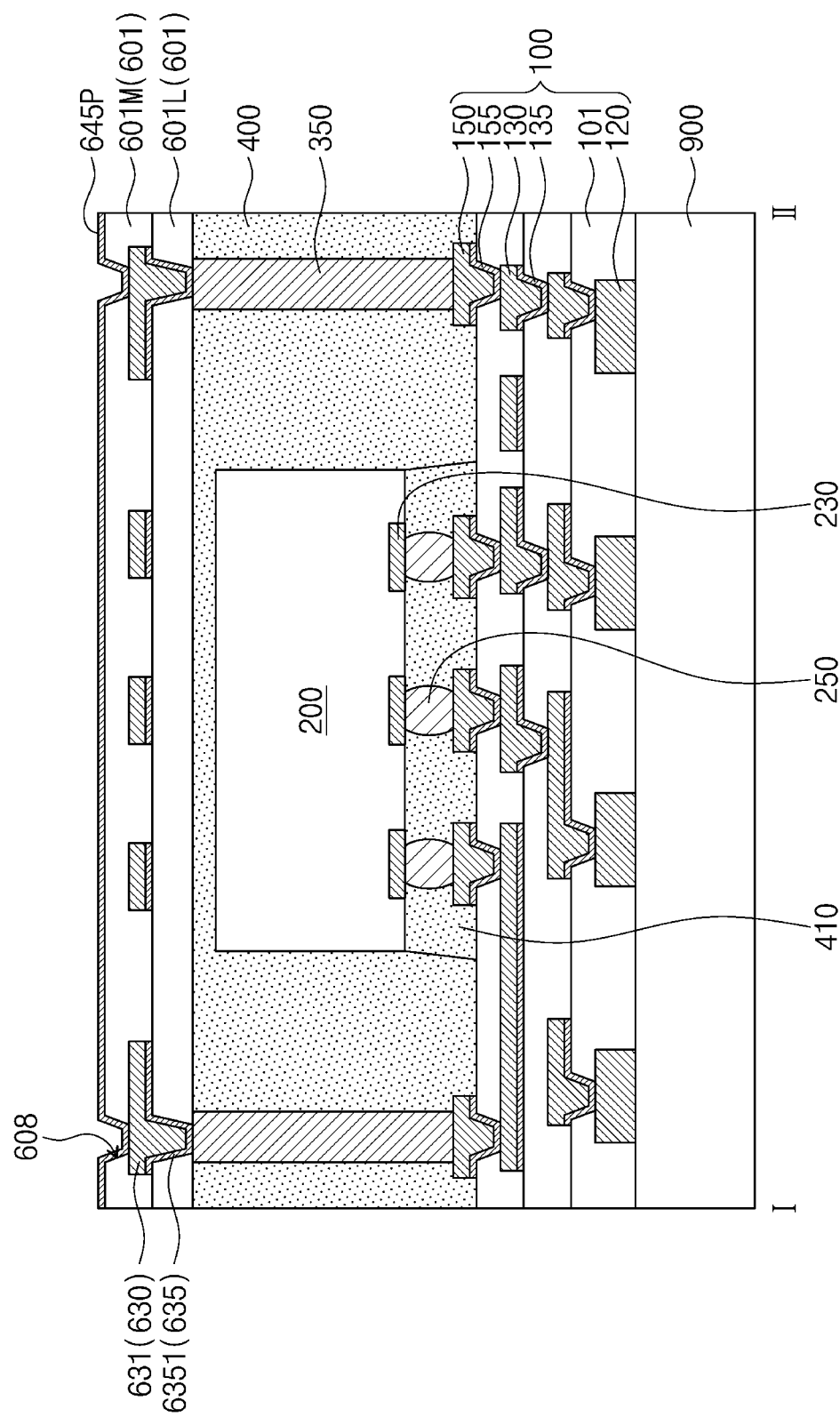

Referring to FIG. 5D, the second insulating layer 601 may be formed on the top surface of the molding layer 400. The second insulating layer 601 may include a second lower insulating layer 601L. The second lower insulating layer 601L may expose top surfaces of the conductive structures 350.

The second seed patterns 635 may be formed on the top surface of the conductive structures 350, and may extend on a top surface of the second lower insulating layer 601L. The second seed patterns 635 may include second lower seed patterns 635L.

The second redistribution patterns 630 may be formed to cover the second lower seed patterns 635L. The second redistribution patterns 630 may be the second lower redistribution patterns 631. Forming the second lower seed patterns 635L and the second lower redistribution patterns 631 may be the same as or similar to that described in the example of forming the first seed patterns 135 and the first redistribution patterns 130 of FIG. 5A, respectively.

Thereafter, forming the second insulating layer 601 may be repeatedly performed to form a second intermediate insulating layer 601M. The second intermediate insulating layer 601M may cover the second lower insulating layer 601L and the second lower redistribution patterns 631. The second intermediate insulating layer 601M may be formed by a coating process using a photosensitive insulating material. The second intermediate insulating layer 601M may be patterned by an exposure and development process to form lower openings 608. The lower openings 608 may penetrate the second intermediate insulating layer 601M and expose the second lower redistribution patterns 631.

A first preliminary seed layer 645P may be formed in the lower openings 608 and on a top surface of the second intermediate insulating layer 601M. The first preliminary seed layer 645P may include a conductive seed material.

Figure 5E:
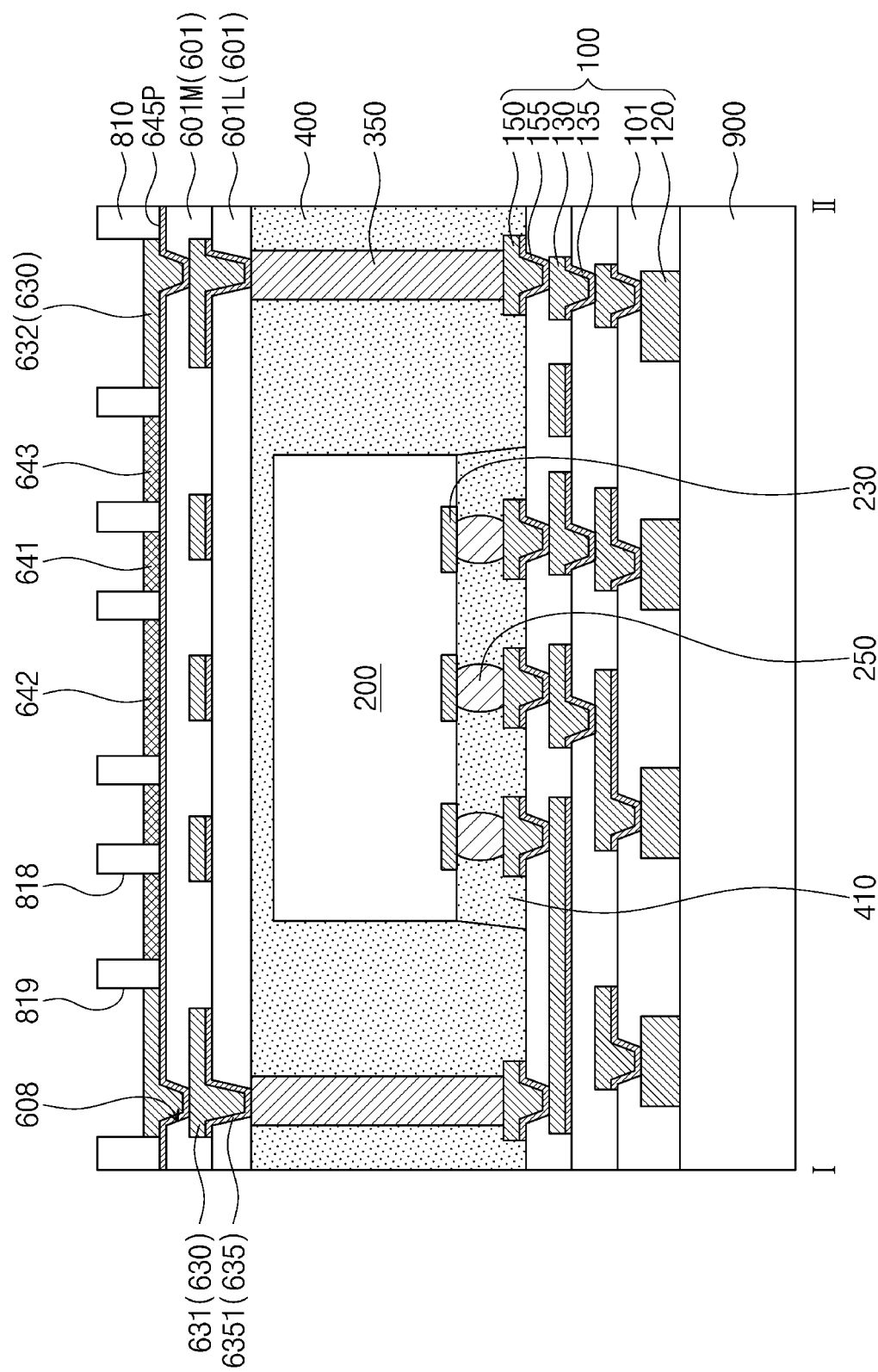

Referring to FIG. 5E, a first resist pattern 810 may be formed on the first preliminary seed layer 645P. The first resist pattern 810 may have first guide holes 819 and second guide holes 818. The first guide holes 819 and the second guide holes 818 may expose the first preliminary seed layer 645P. The first guide holes 819 may be connected to the lower openings 608. The second guide holes 818 may be spaced apart from the first guide holes 819 and the lower openings 608 in a plan view.

The second upper redistribution patterns 632 may be formed in the lower openings 608 and the first guide holes 819. Each of the second upper redistribution patterns 632 may include the second via part and the second wiring part connected to each other. The second via part of each of the second upper redistribution patterns 632 may be formed in a corresponding lower opening 608. The second via part of each of the second upper redistribution patterns 632 may be formed on the second via part and may extend onto a top surface of the second intermediate insulating layer 601M. The second redistribution patterns 630 may include the second lower redistribution patterns 631 and the second upper redistribution patterns 632.

The second upper redistribution patterns 632 may be disposed in the second guide holes 818, and thus a separate planarization process may not be required. Accordingly, the manufacturing process of the semiconductor package may be simplified.

The first dummy conductive pattern 641, the second dummy conductive pattern 642, and the third dummy conductive pattern 643 may be formed in the second guide holes 818. The first to third dummy conductive patterns 641, 642, and 643 may be laterally spaced apart from one another. The first to third dummy conductive patterns 641, 642, and 643 may be spaced apart from the second upper redistribution patterns 632.

The first to third dummy conductive patterns 641, 642, and 643 may be disposed in the corresponding second guide holes 818, and thus a separate planarization process may not be required. Accordingly, the manufacturing process of the semiconductor package may be simplified.

The first to third dummy conductive patterns 641, 642, and 643 may be formed by a single process with the second upper redistribution patterns 632. Forming the second upper redistribution patterns 632 and the first to third dummy conductive patterns 641, 642, and 643 may include performing an electroplating process using the first preliminary seed layer 645P as an electrode.

Figure 5F:
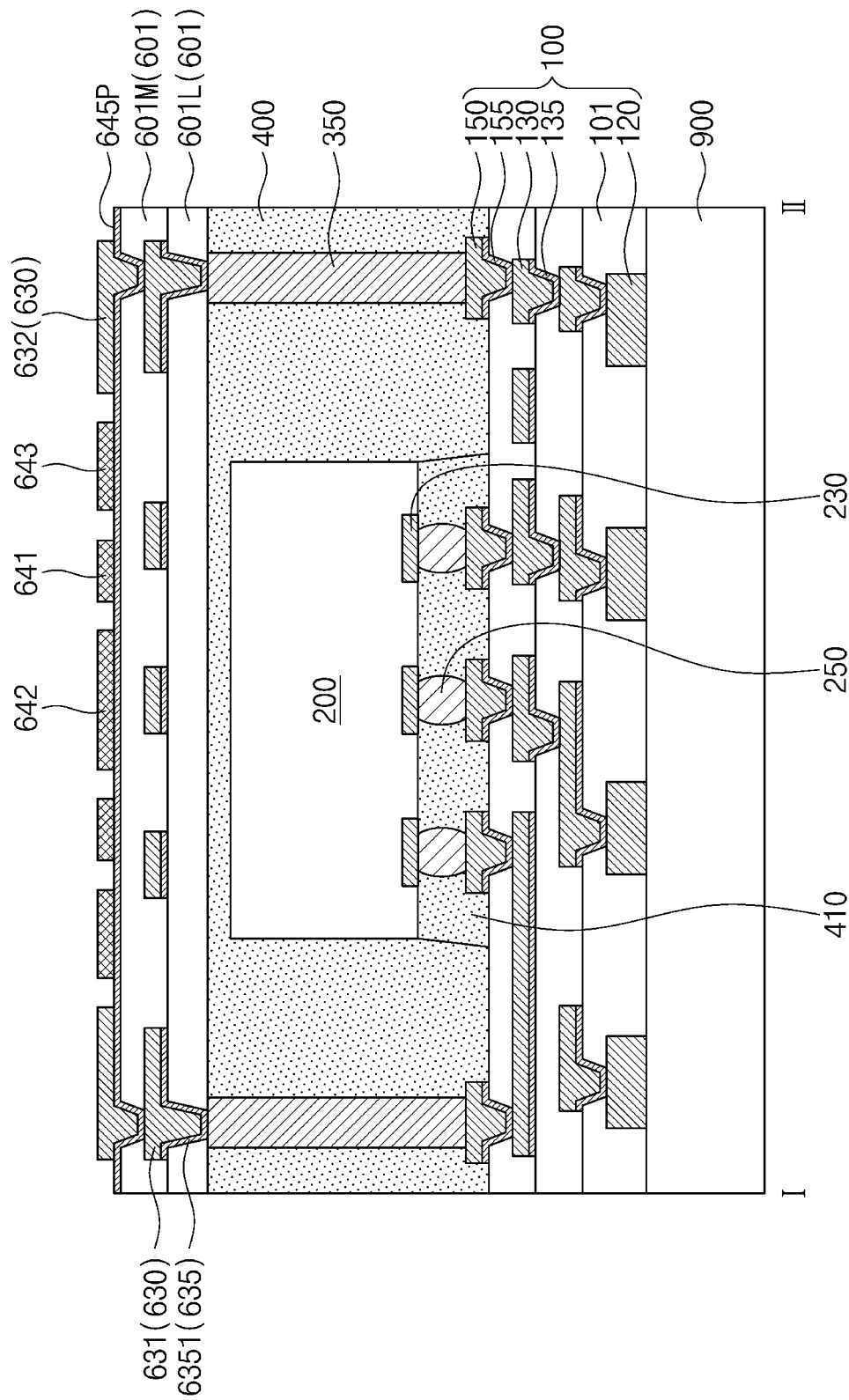

Referring to FIG. 5F, the first resist pattern 810 may be removed to expose a first part of the first preliminary seed layer 645P. The first resist pattern 810 may be removed by a strip process. Second parts of the first preliminary seed layer 645P may be provided on bottom surfaces of the second upper redistribution patterns 632. Third parts of the first preliminary seed layer 645P may be provided on the bottom surfaces of the first to third dummy conductive patterns 641, 642, and 643.

Figure 5G:
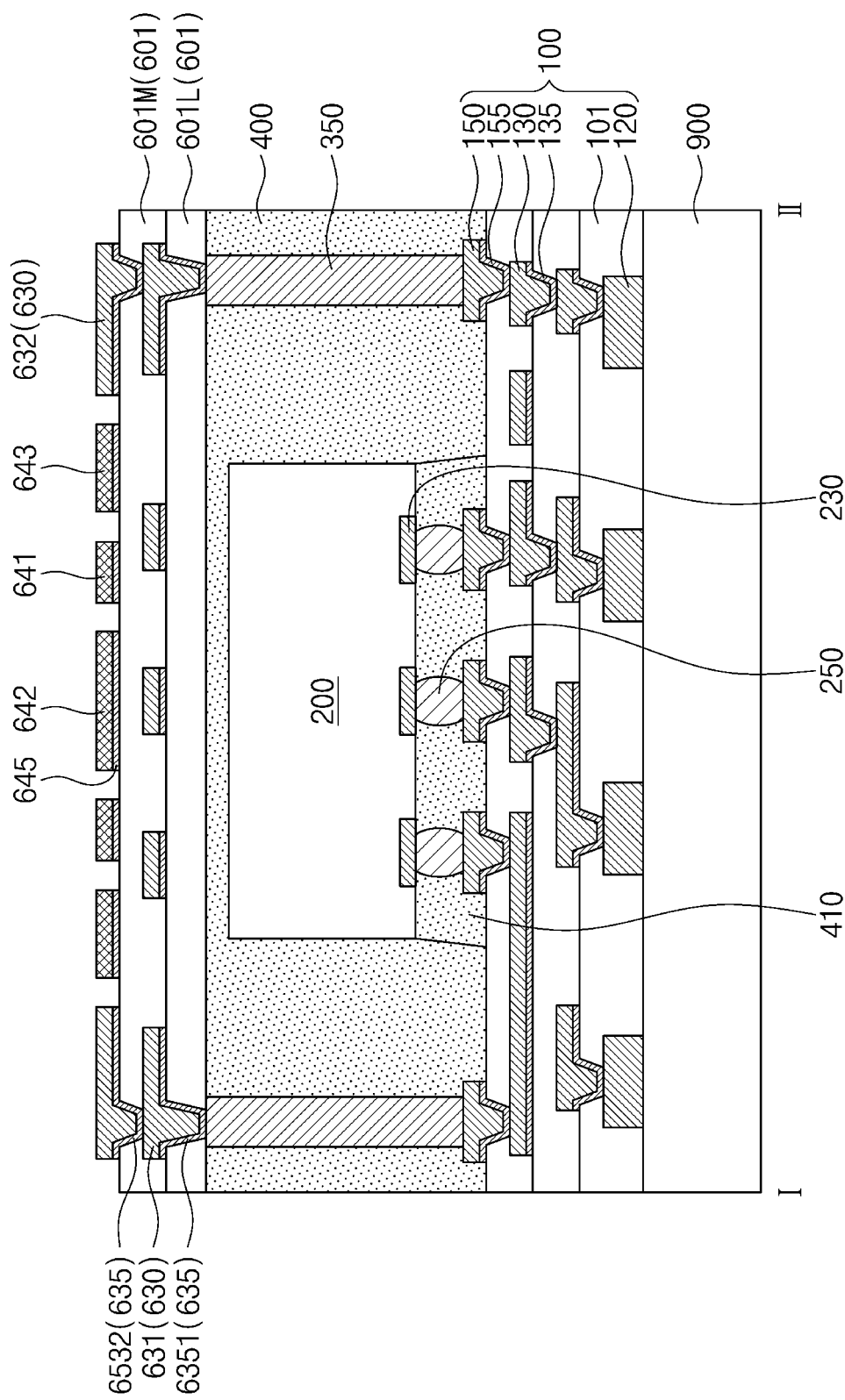

Referring to FIG. 5G, the exposed first part of the first preliminary seed layer 645P may be removed to form second upper seed patterns 6352 and dummy seed patterns 645. Removing the first part of the first preliminary seed layer 645P may be performed by an etching process. The second parts and third parts of the first preliminary seed layer 645P may not be exposed to the etching process. After the etching process, the second parts of the remaining first preliminary seed layer 645P may form the second upper seed patterns 6352 that are separated from one another. The second upper seed patterns 6352 may be respectively provided on the bottom surfaces of the second upper redistribution patterns 632. After the etching process, the remaining third parts of the first preliminary seed layer 645P may form the dummy seed patterns 645 separated from one another. The dummy seed patterns 645 may be provided on the bottom surfaces of the first to third dummy conductive patterns 641, 642, and 643, respectively. The second seed patterns 635 may include the second lower seed patterns 6351 and second upper seed patterns 6352.

Figure 5H:
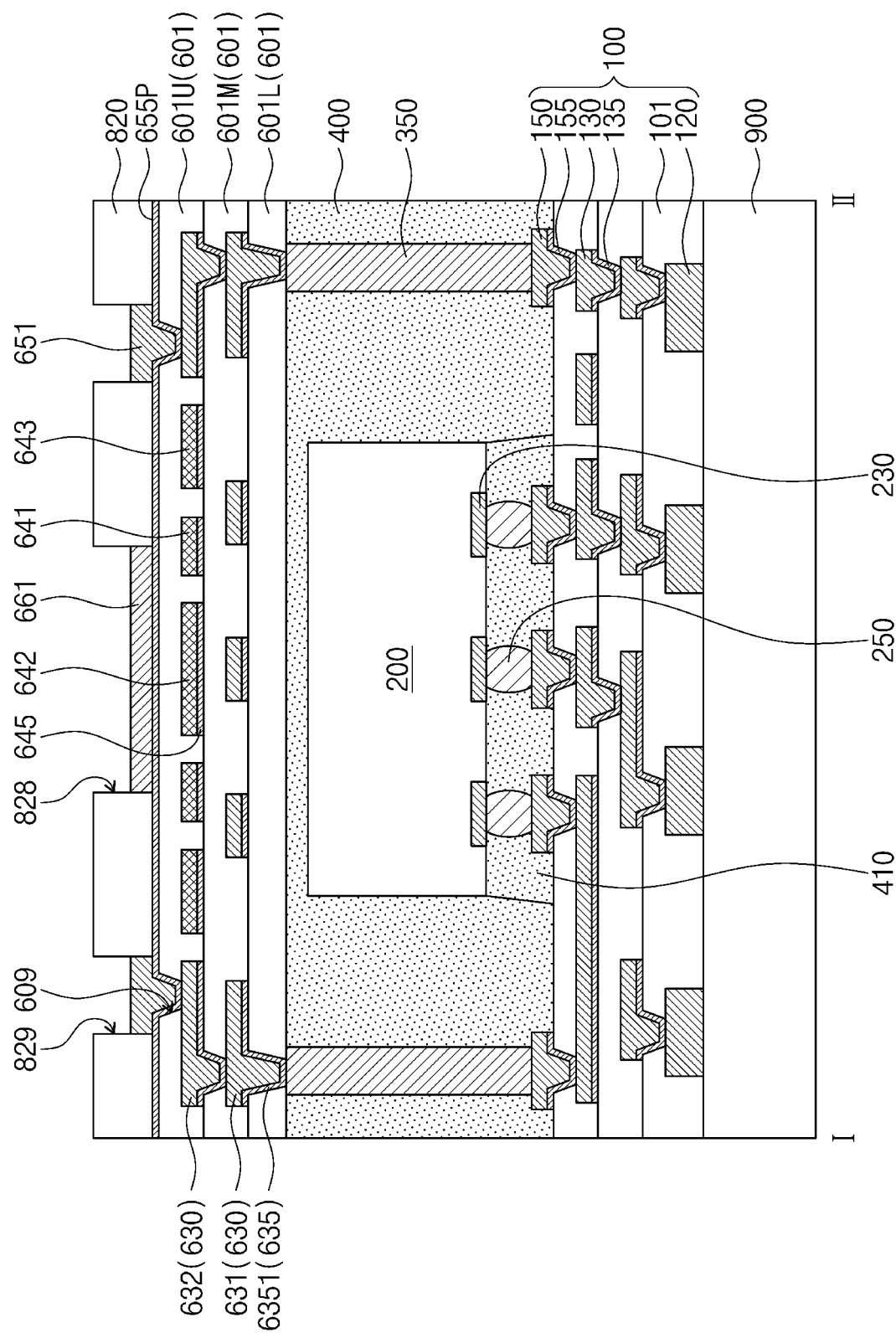

Referring to FIG. 5H, a second upper insulating layer 601U may be formed on the second intermediate insulating layer 601M, the second upper redistribution patterns 632, and the first to third dummy conductive patterns 641, 642, and 643. The second upper insulating layer 601U may include the same material as the second intermediate insulating layer 601M. The second upper insulating layer 601U may be patterned by an exposure and development process to form upper openings 609. The upper openings 609 may expose the second upper redistribution patterns 632. The upper openings 609 may not expose the first to third dummy conductive patterns 641, 642, and 643.

A second preliminary seed layer 655P may be formed in the upper openings 609 and on the second upper insulating layer 601U. The second preliminary seed layer 655P may cover the exposed second redistribution pads 650. The second preliminary seed layer 655P may be spaced apart from the first to third dummy conductive patterns 641, 642, and 643. The second preliminary seed layer 655P may include a conductive seed material.

A second resist pattern 820 may be formed on the second preliminary seed layer 655P. The second resist pattern 820 may have third guide holes 829 and fourth guide holes 828. The third guide holes 829 and the fourth guide hole 828 may expose the second preliminary seed layer 655P. The third guide holes 829 may be connected to the upper openings 609. The fourth guide hole 828 may be spaced apart from the lower openings 608 and the third guide holes 829 in a plan view.

The second redistribution pads 650 may be formed in the upper openings 609 and corresponding third guide holes 829. The lower part of each of the second redistribution pads 650 may be formed in a corresponding upper opening 609. The upper part of each of the second redistribution pads 650 may be formed under a corresponding third guide hole 829.

The metal pattern 661 may be formed in the third guide holes 829. The metal pattern 661 may not be provided in the upper opening 609. The metal pattern 661 may be formed with the second redistribution pads 650. by a single process Forming the second redistribution pads 650 and the metal pattern 661 may include performing an electroplating process using the second preliminary seed layer 655P as an electrode. The metal pattern 661 may be spaced apart from the second redistribution pads 650.

The second redistribution pads 650 may be disposed in the third guide holes 829 and the metal pattern 661 may be disposed in the fourth guide hole 828, and thus a separate planarization process may not be required. Accordingly, the manufacturing process of the semiconductor package may be simplified.

Figure 5I:
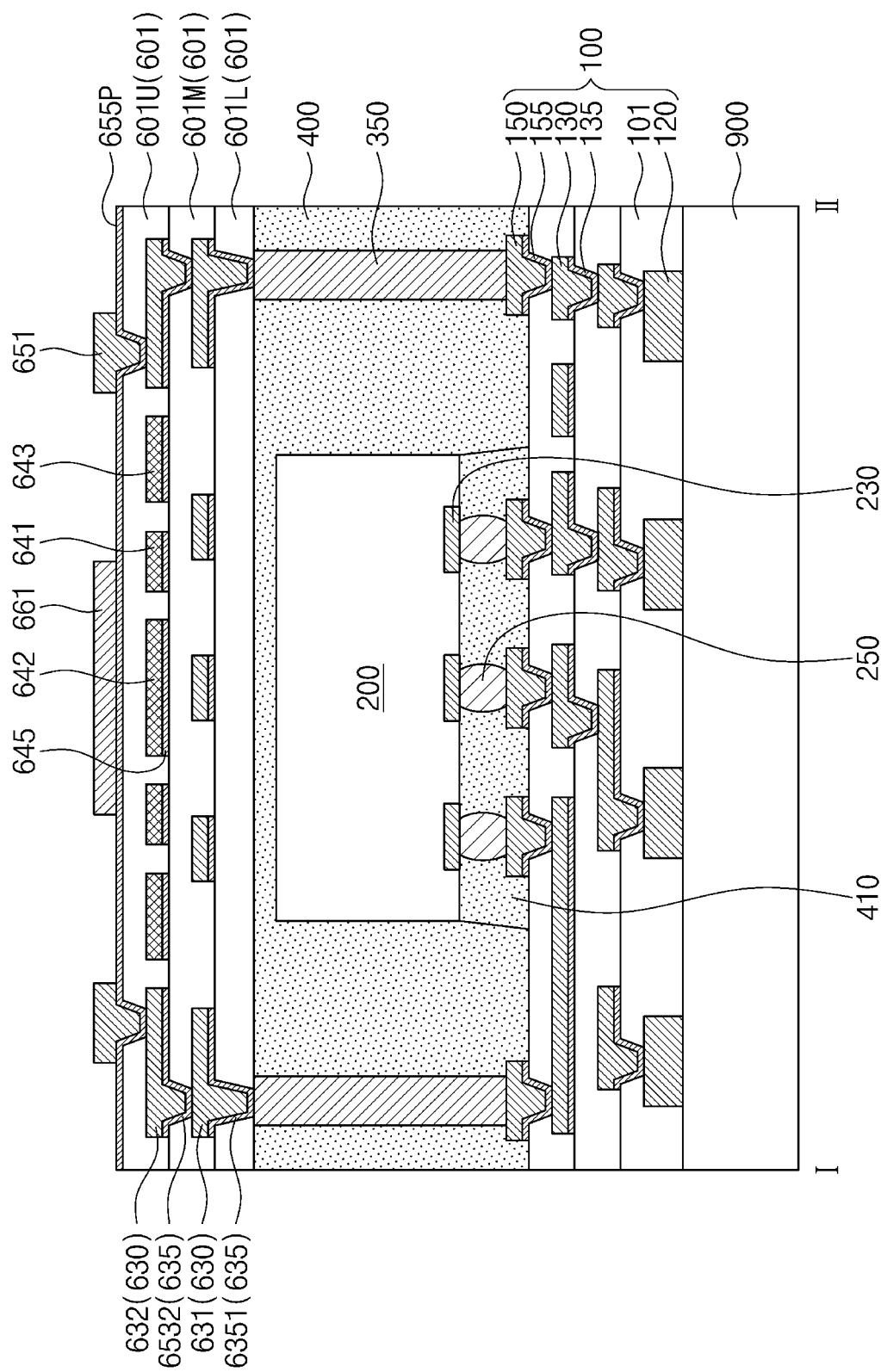

Referring to FIG. 5I, the second resist pattern 820 may be removed to expose a first part of the second preliminary seed layer 655P. The removal of the second resist pattern 820 may be performed by a strip process. Second parts of the second preliminary seed layer 655P may be provided on bottom surfaces of the second redistribution pads 650. A third part of the second preliminary seed layer 655P may be provided on bottom surface of the metal pattern 661.

Figure 5J:
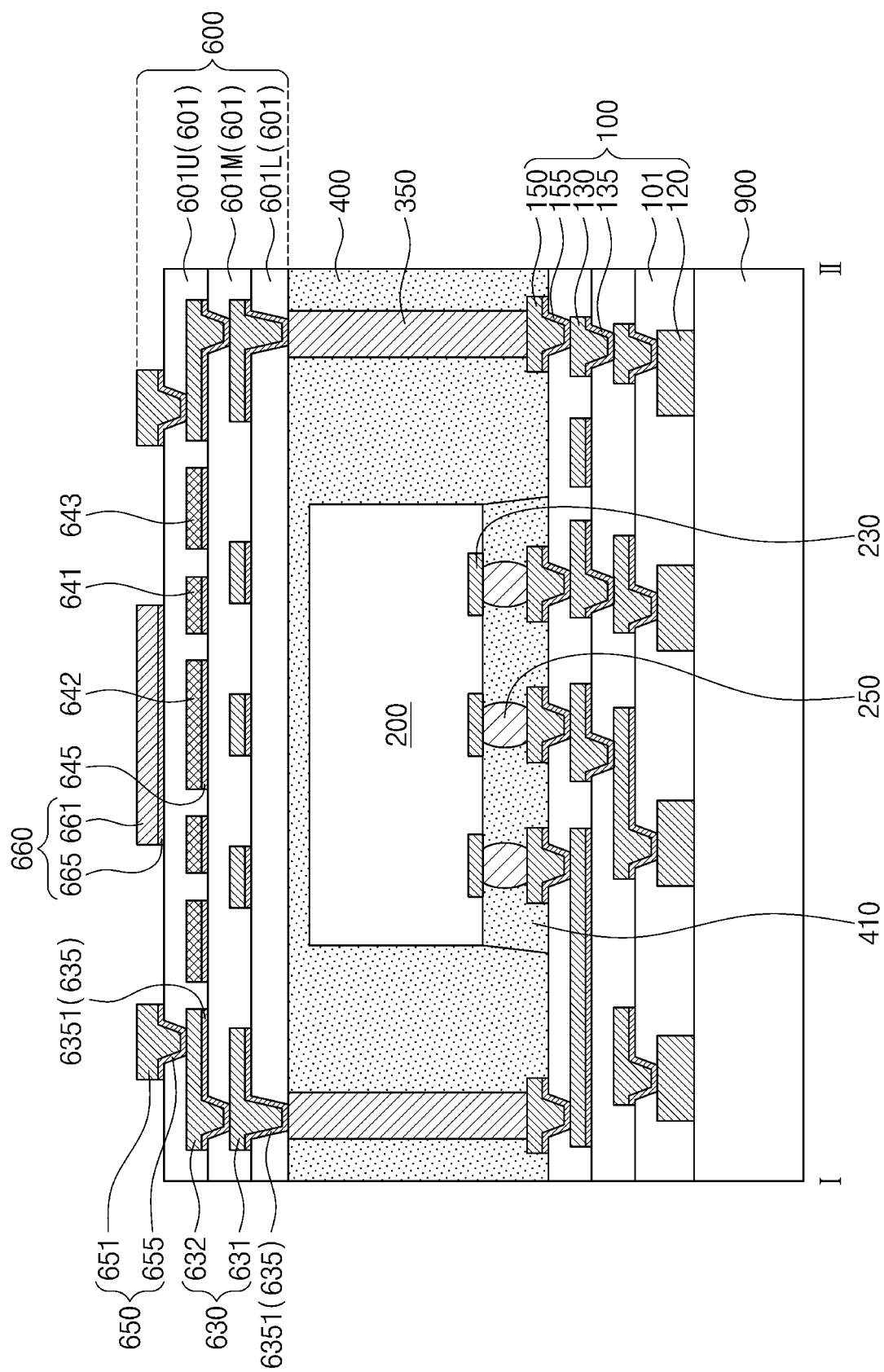

Referring to FIG. 5J, the exposed first part of the second preliminary seed layer 655P may be removed to form the second seed pad 655 and the marking seed pattern 665. The removal of the first part of the second preliminary seed layer 655P may be performed by an etching process. The second parts and the third part of the second preliminary seed layer 655P may not be exposed to the etching process. After the etching process, the second parts of the remaining second preliminary seed layer 655P may form the plurality of second seed pads 655 separated from one another. The second seed pads 655 may be respectively provided on bottom surfaces of the conductive pads 651. Accordingly, the second redistribution pads 650 may be formed. The second redistribution patterns 630 may include the second seed pads 655 and the conductive pads 651.

After the etching process, the third part of the remaining second preliminary seed layer 655P may form the marking seed pattern 665. The marking seed pattern 665 may be provided on the bottom surface of the metal pattern 661. Accordingly, the marking metal layer 660 may be formed. The marking metal layer 660 may include the marking seed pattern 665 and the metal pattern 661.

Manufacturing of the second redistribution substrate 600 may be completed by the examples described so far. The second redistribution substrate 600 may include the second insulating layers 601, the second redistribution patterns 630, the second seed patterns 635, and the first to third dummy conductive patterns 641, 642, and 643, the dummy seed patterns 645, second redistribution pads 650, and the marking metal layer 660. The second insulating layers 601 may include the stacked second lower insulating layer 601L, the second intermediate insulating layer 601M, and the second upper insulating layer 601U.

Figure 5K:
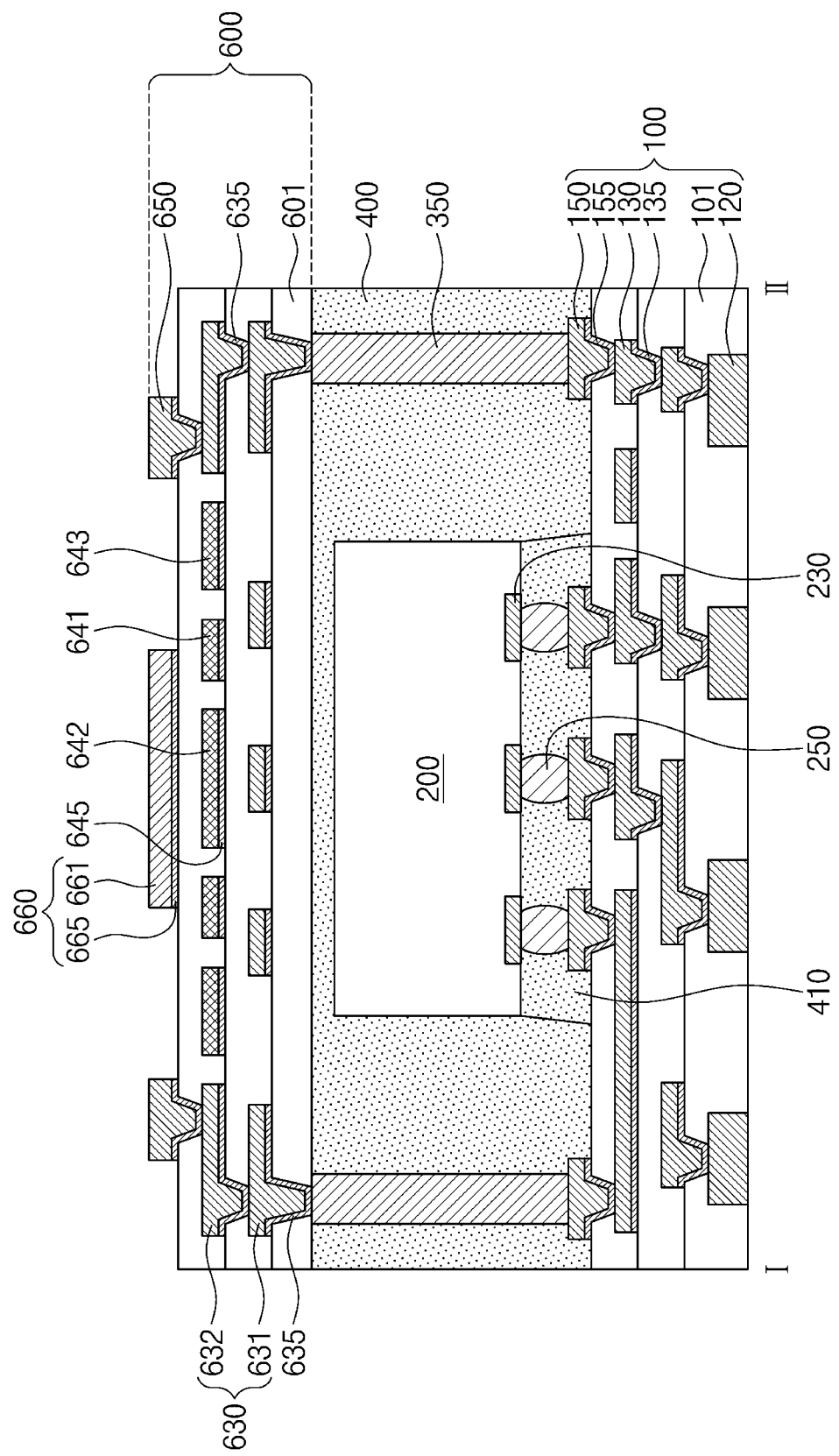

Referring to FIG. 5K, the temporary substrate 900 may be removed to expose the bottom surface of the first redistribution substrate 100. For example, the bottom surface of the lowermost first insulating layer 101 and the bottom surfaces of the under bump patterns 120 may be exposed.

Referring back to FIG. 1D, the solder balls 500 may be respectively formed on the bottom surfaces of the under bump patterns 120. The manufacturing of the semiconductor package 10 may be completed by the examples described so far.

According to example embodiments, the redistribution substrate may include the marking metal layer and the dummy conductive pattern. The dummy conductive pattern may vertically overlap the sidewalls of the marking metal layer. Accordingly, the damage to the redistribution substrate may be prevented. The semiconductor package may have improved reliability and durability.

While aspects of example embodiments have been particularly shown and described, it will be understood variations in form and detail may be made therein without departing from the spirit and scope of the attached claims.

What is claimed is:
1. A semiconductor package comprising:
a first redistribution substrate;
a semiconductor chip provided on the first redistribution substrate;
a molding layer provided on the first redistribution substrate and the semiconductor chip; and
a second redistribution substrate provided on the molding layer,
wherein the second redistribution substrate comprises:
redistribution patterns spaced apart from one another;
a first dummy conductive pattern spaced apart from the redistribution patterns;
an insulating layer provided on the first dummy conductive pattern; and
a marking metal layer provided on the insulating layer and spaced apart from the first dummy conductive pattern, and
wherein sidewalls of the marking metal layer overlap the first dummy conductive pattern along a vertical direction perpendicular to an upper surface of the first redistribution substrate.

2. The semiconductor package of claim 1, wherein the second redistribution substrate further comprises:
a second dummy conductive pattern spaced apart from an inner wall of the first dummy conductive pattern; and
a third dummy conductive pattern spaced apart from an outer wall of the first dummy conductive pattern.

3. The semiconductor package of claim 2, wherein the marking metal layer is electrically insulated from the first dummy conductive pattern, the second dummy conductive pattern and the third dummy conductive pattern.

4. The semiconductor package of claim 2, wherein the marking metal layer overlaps the first dummy conductive pattern along the vertical direction.

5. The semiconductor package of claim 4, wherein the marking metal layer is spaced apart from the third dummy conductive pattern along the vertical direction.

6. The semiconductor package of claim 1, further comprising conductive structures provided between the first redistribution substrate and the second redistribution substrate,
wherein the second redistribution substrate further comprises second redistribution patterns connected to the conductive structures, and
wherein the first dummy conductive pattern and the marking metal layer are insulated from the second redistribution patterns.

7. The semiconductor package of claim 6, further comprising redistribution pads provided on the second redistribution patterns and electrically connected to the second redistribution patterns,
wherein the redistribution pads are provided in an edge region of the second redistribution substrate along the vertical direction, and
wherein the marking metal layer is provided in a center region of the second redistribution substrate along the vertical direction.

8. The semiconductor package of claim 7, wherein the redistribution pads are insulated from the marking metal layer.

9. The semiconductor package of claim 1, wherein a top surface of the marking metal layer is exposed through the second redistribution substrate.

10. The semiconductor package of claim 9, wherein the top surface of the marking metal layer comprises:
a first top surface having a first surface roughness; and
a second top surface having a second surface roughness that is different from the first surface roughness.

11. A semiconductor package comprising:
a first redistribution substrate;

a semiconductor chip provided on the first redistribution substrate;

a molding layer provided on the first redistribution substrate and the semiconductor chip; and a second redistribution substrate provided on the molding layer, wherein the second redistribution substrate comprises:
a redistribution pattern;
a first dummy conductive pattern insulated from the redistribution pattern;
a second dummy conductive pattern insulated from the redistribution pattern;
a third dummy conductive pattern insulated from the redistribution pattern; and
a marking metal layer provided on the second dummy conductive pattern, wherein the first dummy conductive pattern is provided between the second dummy conductive pattern and the third dummy conductive pattern, and wherein the marking metal layer overlaps a first portion of the first dummy conductive pattern along a vertical direction perpendicular to an upper surface of the first redistribution substrate, and is offset from a second portion of the first dummy conductive pattern along the vertical direction.

12. The semiconductor package of claim 11, wherein the third dummy conductive pattern is provided between the redistribution pattern and the second dummy conductive pattern along a horizontal direction parallel to the upper surface of the first redistribution substrate.

13. The semiconductor package of claim 12, further comprising redistribution pads provided on the and electrically connected to the redistribution pattern,
wherein the redistribution pads are spaced apart from the marking metal layer along the horizontal direction.

14. The semiconductor package of claim 11, wherein the marking metal layer is insulated from each of the first dummy conductive pattern, the second dummy conductive pattern, the third dummy conductive pattern, and the redistribution pattern.

15. The semiconductor package of claim 11, wherein a plurality of first holes are formed through the first dummy conductive pattern, and
wherein a plurality of second holes are formed through the third dummy conductive pattern.

16. A semiconductor package comprising:
a first redistribution substrate comprising a first insulating layer, a first seed pattern, and a first redistribution pattern;
a solder ball provided on a bottom surface of the first redistribution substrate;
a semiconductor chip provided on a top surface of the first redistribution substrate;
conductive structures provided on the top surface of the first redistribution substrate and spaced apart from the semiconductor chip along a horizontal direction parallel to an upper surface of the first redistribution substrate;

a molding layer provided between the semiconductor chip and the conductive structures, and on the semiconductor chip; and a second redistribution substrate provided on the molding layer, wherein the second redistribution substrate comprises:
second redistribution patterns electrically connected to the conductive structures;
second redistribution pads provided on and electrically connected to the second redistribution patterns;
a dummy conductive pattern spaced apart from the second redistribution patterns along the horizontal direction; and
a marking metal layer spaced apart from the second redistribution pads along the horizontal direction, wherein the dummy conductive pattern comprises a first dummy conductive pattern, a second dummy conductive pattern, and a third dummy conductive pattern that are spaced apart from one another along the horizontal direction, wherein the marking metal layer overlaps a first portion of the first dummy conductive pattern and the second dummy conductive pattern along a vertical direction perpendicular to the upper surface of the first redistribution substrate, and wherein the marking metal layer is offset from a second portion of the first dummy conductive pattern and the third dummy conductive pattern along the vertical direction.

17. The semiconductor package of claim 16, wherein the marking metal layer is electrically insulated from each of the first dummy conductive pattern, the second dummy conductive pattern and the third dummy conductive pattern.

18. The semiconductor package of claim 16, wherein the marking metal layer comprises a marking seed pattern having a metal pattern,
wherein one of the second redistribution pads comprises:
a seed pad; and
a conductive pad provided on the seed pad,
wherein the marking seed pattern and the seed pad comprise a first common material, and
wherein the metal pattern and the conductive pad comprise a second common material.

19. The semiconductor package of claim 16, wherein the second redistribution pads are provided in an edge region of the second redistribution substrate in a plan view, and
wherein the marking metal layer is provided in a center region of the second redistribution substrate in the plan view.

20. The semiconductor package of claim 16, wherein the first dummy conductive pattern is provided between the second dummy conductive pattern and the third dummy conductive pattern,
wherein a first interval between the first dummy conductive pattern and the second dummy conductive pattern is 1 μm to 5 mm, and
wherein a second interval between the first dummy conductive pattern and the third dummy conductive pattern is 1 μm to 5 mm.

* * * * *